United States Patent [19]
Okuda et al.

[11] Patent Number: 5,813,233
[45] Date of Patent: Sep. 29, 1998

[54] THERMOELECTRIC COOLING DEVICE AND SYSTEM THEREOF

[75] Inventors: Hideaki Okuda, Nara; Akira Takushima, Yamatotakada, both of Japan

[73] Assignee: Sharp Kabushiki Kaisha, Osaka, Japan

[21] Appl. No.: 567,496

[22] Filed: Dec. 5, 1995

[30] Foreign Application Priority Data

Dec. 28, 1994 [JP] Japan ................................. 6-328774

[51] Int. Cl.$^6$ ............................. F25B 21/02; G02F 1/13
[52] U.S. Cl. ............................................................. 62/3.7
[58] Field of Search ............................... 62/3.2, 3.3, 3.6, 62/3.7

[56] References Cited

U.S. PATENT DOCUMENTS 5,398,510  3/1995  Gilley et al. ................................. 62/3.6
5,572,407  11/1996  Sobhani ................................. 361/719

FOREIGN PATENT DOCUMENTS

| 1-92635 | 6/1989 | Japan . |
| 5-10628 | 1/1993 | Japan . |
| 5-27564 | 4/1993 | Japan . |
| 6-2337 | 1/1994 | Japan . |

*Primary Examiner*—William Doerrler

[57] ABSTRACT

A thermoelectric module of a Peltier element is placed on a rectangular-projected portion of a highly thermally conductive module base made from aluminum. A heat-absorbing fin member used as a cold-side absorber is fixed to the rectangular-projected portion of the module base while a radiating fin member used as a hot-side radiator is fixed to a flat portion of the module base.

15 Claims, 22 Drawing Sheets

THERMOELECTRIC COOLING DEVICE AND SYSTEM THEREOF

BACKGROUND OF THE INVENTION

(1) Field of the Invention

The present invention relates to a thermoelectric cooling device using a thermoelectric module, and in particular relates to a thermoelectric cooling system for cooling a liquid crystal panel and/or a light-incident side polarizing plate etc., as to be heat-generating elements in a liquid crystal projector.

(2) Description of the Background Art

There have been thermoelectric cooling devices using a thermoelectric module of the Peltier element that utilizes the Peltier effect. The advantages of the thermoelectric cooling device of this kind are its extremely simple and compact configuration. Accordingly, devices of this kind have attracted a good deal of attention and have been widely used in various fields.

FIG. 1 is a configuration example of a thermoelectric cooling device. This thermoelectric cooling device includes: a thermoelectric module 1; heat-absorbing fin member 2 as a heat absorber; and radiating fin member 3 as a heat emitter. In order to improve thermal contact among the thermoelectric module 1, the heat-absorbing fin member 2 and radiating fin member 3, a plurality of bolts 4 and nuts 5 are used to fasten between the members 2 and 3. It is also possible to use a plurality of screws 6 to fasten them as shown in FIG. 2.

In this arrangement, some heat transfers through the bolts 4 or screws 6 from the radiating fin member 3 which is high in temperature to the heat-absorbing fin member 2 which has a low temperature, thereby degrading the heat efficiency. Therefore, in order to avoid the bolts 4 or screws 6 from directly contacting the heat-absorbing fin member 2 and the radiating fin member 3, spacers 7 made of resin or the like are provided as shown in FIG. 3. Since the thermoelectric module 1 is typically made of brittle material, an impact absorber 8 made of Bakelite or the like for absorbing impacts, may be interposed as shown in FIG. 4 in order to prevent the module from being damaged at the time of assembly.

The configuration shown in FIG. 1 has only one thermoelectric module, it is also possible to provide a plurality of thermoelectric modules to obtain a desired heat absorbing capacity. As such a configuration, each thermoelectric module may have a separate heat-absorbing fin member, as shown in FIG. 5 (see Japanese Utility Model Application Laid-Open Hei 5 No.27,564).

In consideration of thermoelectrically converting performance, the thermoelectric module 1 is formed to be as thin as about 4 mm. Accordingly, the radiating fin member which will become high in temperature is disposed near to the heat-absorbing fin member which will and should be low in temperature. In such an arrangement, heat emitted from the radiating fins transfers to heat-absorbing fins, to lower the heat absorbing quantity by the heat-absorbing fins, thus the thermoelectric module is degraded as to its efficiency. To avoid this, to reduce the heat transfer from the former to the latter, a pair of blocks 9 and 10 are disposed on heat-absorbing and radiating sides, respectively to sandwich the thermoelectric module 1, as shown in FIG. 6. One of the heat-absorbing and radiating side blocks 9, 10, may effectively be provided alone. A plurality of bolts 11 and nuts 12 are provided to fasten the two blocks 9 and 10. As shown in FIG. 7. it is also possible to fasten the two blocks with a plurality of bolts 13 alone. As shown in FIG. 8, there is also a configuration in which the blocks 9 and 10 are pressed and fixed by pinch clamps 14 made of plastic (see Japanese Patent Application Laid-Open Hei 5 No.10,628).

Since part of light emitted from the light emitting lamp is converted into heat, the thus generated heat makes the apparatus inside hot. Accordingly, optical elements such as the liquid crystal panel, the light-incident side polarizing plate etc. assembled in the liquid crystal projector should be cooled to be kept at a permissible temperature or lower designated in order to maintain characteristics of those parts and prevent them from being degraded with the passage of time. Further, the liquid crystal panel as to be one of the optical elements is preferably formed of a structure which will not allow dust and dirt to adhere thereto. For the cooling device for the liquid crystal panel and the light-incident side polarizing plate, conventional systems include the following configurations, inclusive of the configuration using the aforementioned Peltier element for cooling.

(1) An air cooling system:

A cooling fan is provided inside an air cooling duct so as to suck air from the outside through a filter. Thus introduced air is adapted to cool the heat-generating elements such as a liquid crystal panel, a light-incident side polarizing plate etc., arranged inside the cooling duct. Then, thus warmed or heated air after having passed through the heat-generating elements is discharged to the outside of the appliance.

(2) A liquid cooling system:

A coolant or cooling liquid is circulated inside a transparent cooling cell in contact with heat-generating portions such as a liquid crystal panel and a light-incident side polarizing plate, by a liquid circuiting pump. Heat generated from the optical elements is transferred to outside radiating fins, whereby a radiating fan discharges the heat to the outside of the appliance.

(3) A system using latent heat of vaporization:

A cooling liquid or coolant that vaporizes at a certain temperature or less is charged into a transparent cooling cell in contact with heat-generating portions such as a liquid crystal panel, a light-incident side polarizing plate etc. As the coolant receives generated heat and therefore evaporates, the heat-generating portions are cooled. In the radiating portion, the vaporized coolant condenses. That is, heat generated from the optical elements is transferred to outside radiating fins, whereby a radiating fan discharges the heat to the outside of the appliance.

(4) A contact-cooling system using a light-transmissive heat-conductor:

A light-transmissive heat-conductor such as sapphire glass is adhered on heat-emitting portions such as a liquid crystal panel, a light-incident side polarizing plate etc., to transfer heat generated from the optical elements to outside radiating fins, whereby a radiating fan discharges the heat to the outside of the appliance.

(5) A contact-cooling system using the Peltier element:

The cold side of a Peltier element is adhered on an opaque part of heat-emitting portions such as a liquid crystal panel, a light-incident side polarizing plate etc., to cool the heat-emitting portions by heat conduction. The hot side of the Peltier element is conductively jointed to outside radiating fins, whereby a radiating fan discharges the heat to the outside of the appliance.

(6) A liquid-cooling system using the Peltier element:

A cooling liquid or coolant is charged into a transparent cooling cell in contact with a liquid crystal panel as to be a heat-generating portion. Heated coolant, due to natural convection, travels upward inside the cell where the cold side of a Peltier element is attached and therefore the convecting coolant is cooled. The hot side of the Peltier element is conductively jointed to outside radiating fins, whereby a radiating fan discharges the heat to the outside of the appliance (see Japanese Utility Model Application Hei 1 No.92,635).

Other than the above configurations, Japanese Utility Model Application Hei 6 No.2,337 discloses a system in which a fan is provided inside a cooling cell with a coolant charged therein, in order to forcibly convect the coolant.

Initially, in the thermoelectric cooling device using a thermoelectric module shown in FIGS. 1 and 2, in order to fix the thermoelectric module sandwiched between the heat-absorbing fin member and the radiating fin member, two bolts or screws on one side are used for the fixture. That is, the step of fixing requires only screwing four bolts, thus the production is extremely simplified. Nevertheless, the heat-absorbing fin member 2 and the radiating fin member 3 are placed closely, heat transfers from the hot side to the cold side through the surrounding air, whereby the heat efficiency is lowered. To deal with this, as shown in FIGS. 6, 7 and 8, the heat-absorbing side block 9 and the radiating side block 10 are used to broaden the distance between the two fin members 2 and 3. This configuration, however, requires 12 bolts, that is, eight bolts for fixing the blocks to the fin members (four bolts for fixing each block to respective fin member) and another four bolts for fixture between the blocks. As a result, the step of fixing blocks becomes markedly more complicated, resulting in degraded production efficiency.

Next, as to the cooling device for a liquid crystal projector, for the conventional configurations (1) through (4) above, all of which have no Peltier element, it is difficult to cool the liquid crystal panel, the light-incident side polarizing plate and other heat-emitting portions down to a designated permissible temperature or less, if the temperature in the outside atmosphere is high.

Further, as to the air-cooling system (1), if the filter is clogged with dust and dirt, pressure loss increases, so that the cooling air is reduced in its airflow amount. Therefore, there is a fear that the heat-emitting portions become elevated in temperature. Frequent cleaning or replacement of the filter may prevent the temperature rise, but imposes an increased burden on the user. There is another big problem in this method that finer dust than the size of mesh of the filter may enter through the filter and contaminate the inside, or dust and dirt may enter the cooling duct when the filter is replaced. The thus entering dust adheres to the liquid crystal panel to thereby deteriorate the projected image. In the liquid crystal projection technology, since the projected image becomes extremely enlarged as compared to the size of the liquid crystal panel, even finest dust could pose problems.

As to the cases (2) to (4), there is no fear of adhesion of dust since the liquid crystal panel, the light-incident side polarizing plate and other heat-emitting elements do not contact the air from the outside.

Nevertheless, in the case of the liquid cooling system (2), fine bubbles inside the liquid or fine dust particles formed by the liquid pump due to friction and the like, could appear over the surface of the liquid crystal and be projected as shadows on the projected image. Further, liquid spill is unavoidable in the configuration of the liquid cooling type.

Since the configuration using latent heat of vaporization of (3) does not use any pump, the structure is simple. Still bubbles formed at the time of evaporation of the coolant at the heat-emitting portion, appear as shadows on the projected image.

Although the contact-cooling system using a light-transmissive heat-conductor of (4), is free from the problem of bubbles, sapphire glass used in this method is very expensive at present, this method is not practical.

Certainly, the contact-cooling system using the Peltier element of (5) is able to efficiently cool the closer side of the liquid crystal panel to the contact face with the Peltier element. Since, however, the glass disposed on the surface of the liquid crystal panel has low thermal conductivity, the middle part of the liquid crystal becomes high in temperature.

In the liquid-cooling configuration (6) using the Peltier element as disclosed in Japanese Utility Model Application Hei 1 No.92,635, the liquid is circulated by the natural convection, therefore highly efficient cooling cannot be expected. Further, since the cooling surface is limited to one of the sides of the liquid crystal panel, it is difficult to deal with heat emission from the rear side of the liquid crystal panel and the light-incident side polarizing plate. Particularly, the light-incident side polarizing plate is spaced by only a few mm from the liquid crystal panel, and this element emits some or several times as much heat as emitted from the liquid crystal panel. Therefore, the measure against the heat emission- and the accompanied temperature rise should be deliberately examined in consideration of the influence of the heat upon the liquid crystal and the heat-resistant temperature of the light-incident side polarizer.

The configuration in which the coolant is forcibly convected by the fan, as disclosed in Japanese Utility Model Application Hei 6 No.2,337, is able to efficiently, cool the liquid crystal panel from both sides. Still, the cooling surface of the liquid crystal panel and the light-incident side polarizing plate is limited to one side. Therefore, the degradation of the optical elements. Other than the liquid crystal panel cannot be avoided with the passage of time.

SUMMARY OF THE INVENTION

The present invention has been achieved in view of what was discussed above, and it is therefore an object of the present invention to provide a thermoelectric cooling device excellent in cooling and manufacturing performances.

Another object of the present invention is to provide a thermoelectric cooling system which is able to cool the liquid crystal panel and the light-incident side polarizing plate down to a designated permissible temperature or less even if the temperature of the outside air is high.

Still another object of the invention is to provide a thermoelectric cooling system which is able to prevent adhesion of dust to the liquid crystal panel.

The present invention has been achieved to attain the above objects and in accordance with a first aspect of the invention, a thermoelectric cooling device for cooling by the Peltier effect, comprises:

a thermoelectric module made of a Peltier element;

a heat-absorber heat-conductively joined to the cold-side portion of the thermoelectric module;

a radiator heat-conductively joined to the hot-side portion of the thermoelectric module; and a rectangular-projected module base formed of a material having a high thermal-conductance, and the device is characterized in that the cold or hot side face of the thermoelectric module is made in contact with the rectangular-projected portion of the module base; and when the cold side face is in contact with the module base, the heat-absorber is made in contact with a flat portion of the module base, whereas when the hot side face is in contact with the module base, the radiator is made in contact with the flat portion of the module base.

In accordance with a second aspect of the invention, a thermoelectric cooling device for cooling by the Peltier effect, comprises:

a thermoelectric module made of a Peltier element;

a heat-absorber heat-conductively joined to the cold-side portion of the thermoelectric module;

a radiator heat-conductively joined to the hot-side portion of the thermoelectric module; and a rectangular-projected module base formed of a material having a high thermal-conductance, and the device is characterized in that the cold or hot side face of the thermoelectric module is made in contact with a flat portion of the module base; and when the cold side face is in contact with the module base, the heat-absorber is made in contact with the rectangular-projected portion of the module base, whereas when the hot side face is in contact with the module base, the radiator is made in contact with the rectangular-projected portion of the module base.

In accordance with a third aspect of the invention, a thermoelectric cooling device for cooling by the Peltier effect, comprises:

a thermoelectric module made of a Peltier element;

a heat-absorber heat-conductively joined to the cold-side portion of the thermoelectric module;

a radiator heat-conductively joined to the hot-side portion of the thermoelectric module; and a module base of Z-shape in section and formed of a material having a high thermal-conductance, and the device is characterized in that the cold or hot side face of the thermoelectric module is made in contact with one of flat portions of the module base; and when the cold side face is in contact with the module base, the heat-absorber is made in contact with the other flat portion of the module base, whereas when the hot side face is in contact with the module base, the radiator is made in contact with the other flat portion of the module base.

A fourth aspect of the invention resides in the thermoelectric cooling device as written in the first, second or third configuration above and is characterized in that, when the heat-absorber or the radiator and the module base are arranged in such a manner as to sandwich the thermoelectric module therebetween and the heat-absorber or the radiator is fixed to the module base by a fixing means, attaching members made from a hard, and brittle or resilient material having low thermal-conductance are interposed between the heat-absorber or radiator and the module base so that the fixing means may not be in contact with the module base.

In accordance with a fifth aspect of the invention, a thermoelectric cooling system utilizing the Peltier effect to cool heat-emitting portions of optical elements in a liquid crystal projector, comprises: a Peltier element; a d.c. power source supplying the Peltier element; a radiator heat-conductively joined to the hot side face of the Peltier element; a radiating fan for sending air-flow to the radiator; a filter for dust removal, disposed in an inlet port for drawing air from the outside; a cooling duct defined by walls composed of optical components inside an optical system; a heat-absorber disposed inside the cooling duct and heat-conductively joined to the cold side face of the Peltier element; and a cooling fan for sending air-flow to the heat-absorber, and the system is constructed so that, in a condition that current is flown through the Peltier element, the cooling fan draws air from the outside and sends the drawn air as being cooled by the heat-absorber, through the cooling duct to heat-emitting portions including a liquid crystal panel and a light-incident side polarizing plate and the like disposed between the walls of the cooling duct, to thereby cool the heat-emitting portions; and the radiating fan draws air from the outside and sends the drawn air through the radiator to thereby discharge heat from the radiator to the outside.

In accordance with a sixth aspect of the invention, a thermoelectric cooling system utilizing the Peltier effect to cool heat-emitting portions of optical elements in a liquid crystal projector, comprises: a Peltier element presenting the Peltier effect; a d.c. power source supplying the Peltier element; a radiator heat-conductively joined to the hot side face of the Peltier element; a radiating fan for sending air-flow to the radiator; a cooling duct defined by walls composed of optical components inside an optical system; a heat-absorber disposed inside the cooling duct and heat-conductively joined to the cold side face of the Peltier element; and a cooling fan for sending air-flow to the heat-absorber, and the system is constructed so that, in a condition that current is flown through the Peltier element, the heat-absorber cools air and the cooling fan circulates the cooled air inside the cooling duct to cool heat-emitting portions including a liquid crystal panel and a light-incident side polarizing plate and the like and recovers the heated air back to the heat-absorber where the heated air is cooled again; and the radiating fan draws air from the outside and sends the drawn air through the radiator to thereby discharge heat from the radiator to the outside.

A seventh aspect of the invention resides in the thermoelectric cooling device as written in the fifth aspect above and is characterized in that a heat-insulating material for the duct is disposed between the heat-absorber and the heat-emitting portions.

An eighth aspect of the invention resides in the thermoelectric cooling device as written in the sixth aspect above and is characterized in that a gas having a good thermal conductivity such as helium gas, neon gas and the like and free from dirt and dust is hermetically charged inside the cooling duct.

A ninth aspect of the invention resides in the thermoelectric cooling device as written in the fifth or sixth aspect above and is characterized in that a vaporizing portion of a heat pipe is heat-conductively joined to the hot-side face of the Peltier element while a condensing portion of the heat pipe is heat-conductively joined to the radiator.

A tenth aspect of the invention resides in the thermoelectric cooling device as written in the fifth or sixth aspects above and is characterized in that air-temperature at the air-outlet of the liquid crystal panel and the light-incident side polarizing plate, and/or air-temperature at the air-inlet of the heat-absorber is detected by temperature sensor means and the temperature of the liquid crystal panel and the light-incident side polarizing plate is estimated based on the detected temperature, whereby the system controls the current flowing through the Peltier element and the rotational frequency of the cooling fan.

An eleventh aspect of the invention resides in the thermoelectric cooling device as written in the fifth or sixth aspects above and is characterized in that air-temperatures at a portion where no light does pass by, on the liquid crystal panel and the light-incident side polarizing plate, and the temperatures of the liquid crystal panel and the light-incident side polarizing plate are estimated based on the detected temperature, whereby the system controls the current flowing through the Peltier element and the rotational frequency of the cooling fan.

In the invention of the above first to third features, the heat-absorber and the radiator are made in contact with the projected portion and the flat portion of the rectangular-projected module base, respectively. Alternatively, the heat-absorber and the radiator are made in contact with a pair of flat portions of the Z-shaped module base, receptively. Accordingly, the distance between the radiator and the heat-absorber can be broadened, so that it is possible to inhibit heat transfer from the former to the latter by the distance. As compared to the aforementioned conventional configuration in which blocks are used, it is possible to reduce the number of fixing means such as bolts and nuts. Since the module base can be made by simply bending a flat plate, it is easy to manufacture. Particularly, the module base of Z-shape in section in the invention of the above third feature, has a less number of bending portions. This configuration further simplifies the manufacturing process.

In the invention of the above fourth feature, the attaching members made from a hard, and brittle or resilient material having low thermal-conductance are interposed between the heat-absorber or radiator and the module base so that the fixing means may not be in contact with the module base. Accordingly, it is possible to reduce heat transfer between the heat-absorber and the radiator through the fixing means. Since the hard, and brittle or resilient attaching members are interposed between the heat-absorber or radiator and the module base, the thermoelectric module sandwiched therebetween is protected by the attaching members. Accordingly, the thermoelectric module is prevented from being damaged by impacts or excessive force of fixture.

In the invention of the above fifth feature, as a d.c. current is flowed through the Peltier element in a predetermined direction, the heat absorber which is heat-conductively joined to the cold side face of the Peltier element and therefore cooled by the Peltier effect, absorbs heat from the cooling air sucked by the cooling fan. The thus cooled, low-temperature air is guided through the cooling duct to heat-emitting portions including a liquid crystal panel and a light-incident side polarizing plate and the like to cool the heat-emitting portions.

In the invention of the above sixth feature, when the circulation of the cooled air is confined inside the system, no air for cooling is exchanged with the air outside. Therefore, no dust will not adhere to the surface of the liquid crystal panel.

In the invention of the above seventh feature, when the cooling duct between the heat-absorber and the heat-emitting portion is insulated, no heat from the air outside will enter the cooling duct, making it possible to improve cooling efficiency.

In the invention of the above eighth feature, when a gas having a good thermal conductivity such as helium gas, neon gas and the like is used, the Peltier element can be operated for cooling, with less power consumption.

In the invention of the above ninth feature, heat from the system can be radiated by transferring the emitted heat by way of the heat pipe from the vaporizing portion of the heat pipe which is heat-conductively joined to the hot-side face of the Peltier element, to the condensing portion of the heat pipe which is heat-conductively joined to the radiator. In this configuration, or the heat pipe increases the freedom of positioning the radiating fin unit.

In the invention of the above tenth and eleventh features, when the system is applied to the liquid crystal projector, the system, in response to the heated temperature of the heat-emitting portions such as said liquid crystal panel and said light-incident side polarizing plate and the like, controls the current flowing through said Peltier element and the air-flow amount for the heat-absorber. As a result, these optical elements can be cooled down to specified permissible temperatures.

BRIEF DESCRIPTION OF THE DRAWINGS

FIG. 20 is a constructional view showing optical elements including heat-emitting portions such as a liquid crystal panel, a light-incident side polarizing plate and the like;

DESCRIPTION OF THE PREFERRED EMBODIMENTS

Embodiments of the invention will hereinafter be described in detail with reference to the accompanying drawings.

Figure 9:
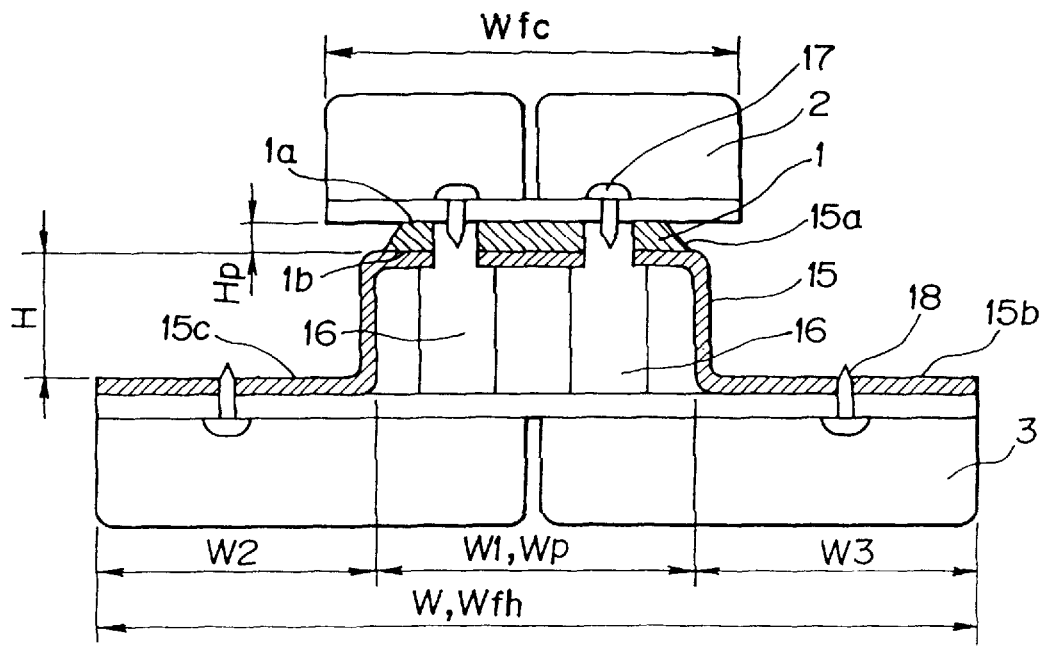
FIG. 9 is a sectional view showing an embodiment of a thermoelectric cooling device of the invention.
Figure 10:
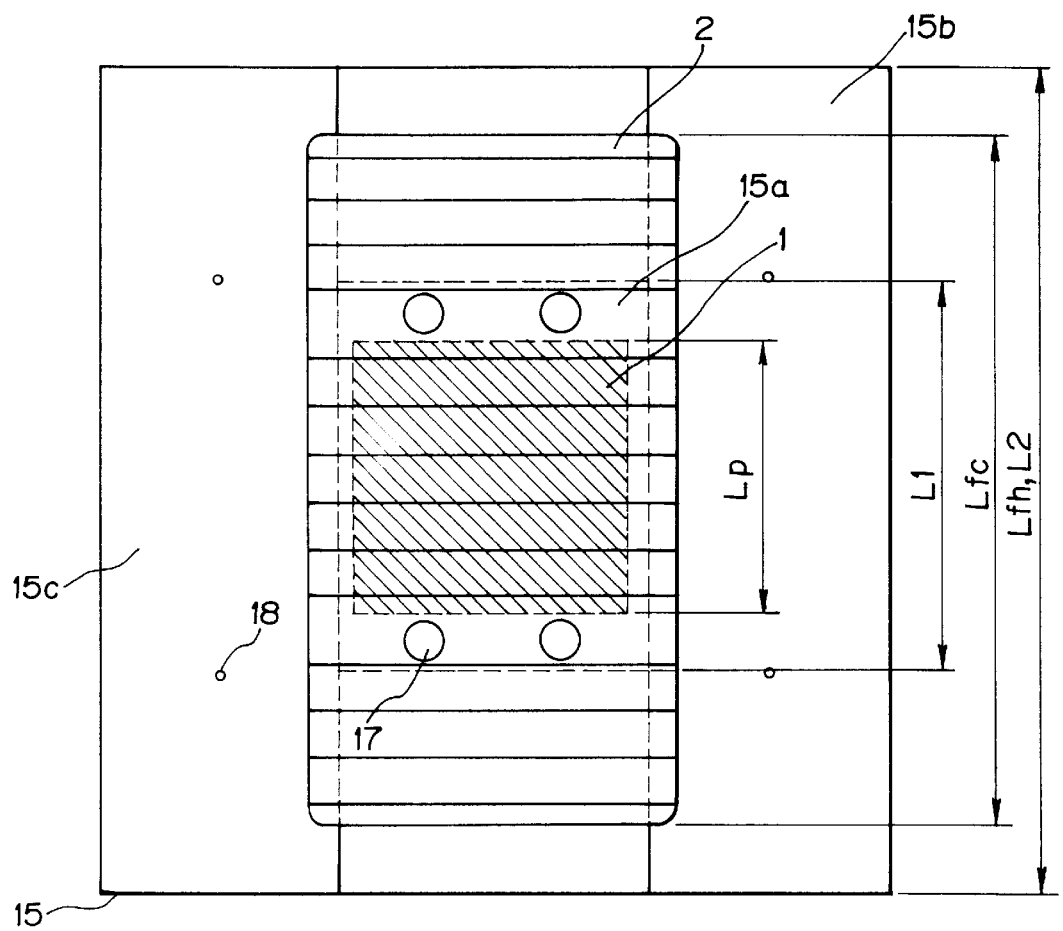
FIG. 10 is a top view sowing the thermoelectric cooling device shown in FIG. 9.

FIG. 9 is a sectional view showing an embodiment of a thermoelectric cooling device in accordance with the invention and FIG. 10 is a top view of the same.

The thermoelectric cooling device of the invention comprises: a thermoelectric module 1 having a Peltier device presenting the Peltier cooling effect; a module base 15 formed of, for example aluminum, magnesium, copper, silver or the like; a heat-absorbing fin member 2 as a cold-side heat-absorber; and a radiating fin member 3 as a hot-side radiator. In order to reduce thermal contact resistance among the thermoelectric module 1, the module base 15, the heat-absorbing fin member 2 and the radiating fin member 3, a heat-conductive grease may be applied to between these elements.

The module base 15 is formed of a flat aluminum plate by bending the plate in such manner as shown in the sectional view of FIG. 9. As shown in FIG. 10, the length L1 of a projected portion 1a is adapted to be longer than the length Lp of the thermoelectric module 1 by such a length as to allow screws to be fixed and to be shorter than the length L2 of the bottom parts 15b and 15c. The thermoelectric module 1 is placed on a rectangular-projected portion 15a of the module base 15 with its radiating side 1b of the module 1 in contact with the module base 15. The width W1 of the rectangular-projected portion 15a is equal to the width Wp of the thermoelectric module 1. The width W of the module base 15 is equal to the width Wfh of the radiating fin member 3. This width is set up to be equal to the widths W1 and W2 and W3 of the bottom parts 15b and 15c. The length L2 of the module base 15 is equal to the length Lfh of the radiating fin member 3. The module base 15 is preferably as thick as possible, but the thickness is determined based on the manufacturing performance and an aftermentioned relation with the height of the module base 15.

The heat balance of the thermoelectric cooling device can be represented by the following expressions, based on the heat-absorbing performance of the thermoelectric module 1, the heat-absorbing amount of the heat-absorbing fin member 2 and the heat emitting amount of the radiating fin member 3. The absorbed amount of heat Qc, the voltage V and the power consumption W of thermoelectric module 1 can be obtained from cold and hot-side temperatures Tc and Th of the thermoelectric module 1 and a current I flowing through the thermoelectric module 1, as follows:

$Qc = n\ (\alpha I Tc - 1/2 I^2 R - K\ (Th-Tc))$ $V = n\ (IR + \alpha(Th-Tc))$ $W = VI$ where n is the number of total thermoelectric module used; α is the Seebeck coefficient; R is resistance of the element; and K is a thermal conductance.

In the above case, since the heat-absorbing fin member 2 absorbs heat equal to the amount of heat Qc, from the air at a temperature of Tac, the following relation holds:

$Qc = Kc\ (Tac - Tfc),$ where Tfc is a representative temperature of the heat-absorbing fin member 2; and Kc is a thermal conductance thereof.

On the other hand, the radiating fin member 3 need radiate the absorbed amount of heat Qc and power consumption W, so that the following relation holds:

$Qc + W = Kh(Tfh - Tah),$ where Tfh is a representative temperature of the radiating fin member 3; Tah is a temperature of air passing through the radiating fin member 3; and Kh is a thermal conductance thereof.

In general, the absorbed amount of heat Qc to be needed, the current I and the cold-side temperature Tc of the thermoelectric module 1 are determined in advance based on the specifications of the thermoelectric module 1 and the aimed performances. Accordingly, the hot-side temperature Th and voltage V and power consumption W of the thermoelectric module 1 can be calculated from the above quantities.

When, as designing conditions for the thermoelectric cooling device, the absorbed air-temperature Tac at which the heat-absorbing fin member 2 absorbs heat from the air and the inlet air-temperature Tah at which the inlet air passes through radiating fin member 3 are known beforehand, respective representative temperatures Tfc and Tfh can be determined, whereby required heat conductance values are determined, respectively. Naturally, the representative temperature Tfc of the heat-absorbing fin member 2 must be higher than the heat-absorbing (cold) side temperature Tc of the thermoelectric module 1 while the representative temperature Tfh of the radiating fin member 3 should be lower than the radiating (hot) side temperature Th. These values Tfc and Tfh are experimentally or empirically determined in consideration of the contact heat-resistance and heat-transfer behavior. A heat conductance is a product of the surface area of fins and the thermal conductance determined by an air-flow speed at which air passes through the fins. That is, specifications of a fin member is determined by considering the air capacity of a fan used and the frontal area of passage etc.

Description of the invention will be now continued, assuming that specifications of the heat-absorbing fin member 2 and the radiating fin member 3 have been determined based on the aforementioned heat designing scheme.

Figure 1:
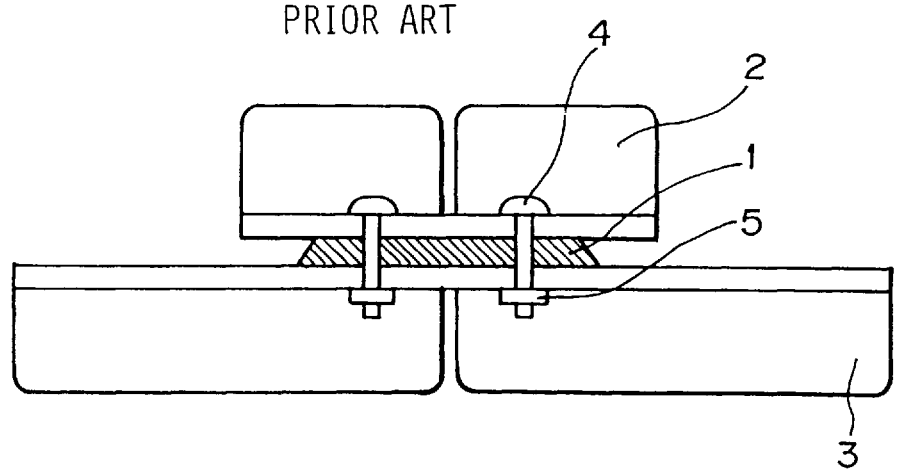
FIG. 1 is a sectional view showing a conventional thermoelectric cooling device in which bolts and nuts are used for fixture.
Figure 2:
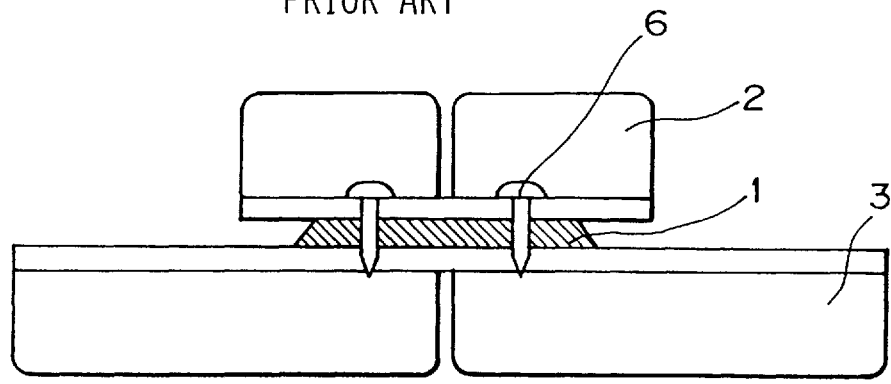
FIG. 2 is a sectional view showing a conventional thermoelectric cooling device in which screws are used for fixture.
Figure 3:
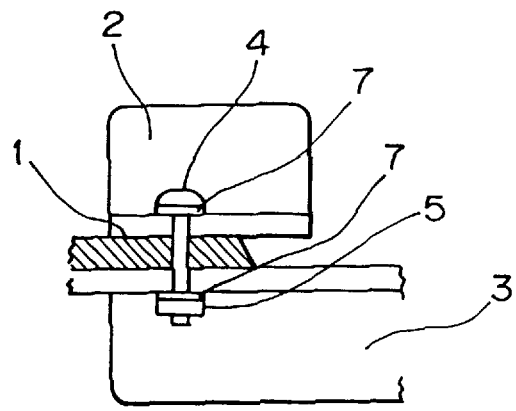
FIG. 3 is a sectional view showing a conventional thermoelectric cooling device in which bolts and nuts are used for fixture with spacers.
Figure 4:
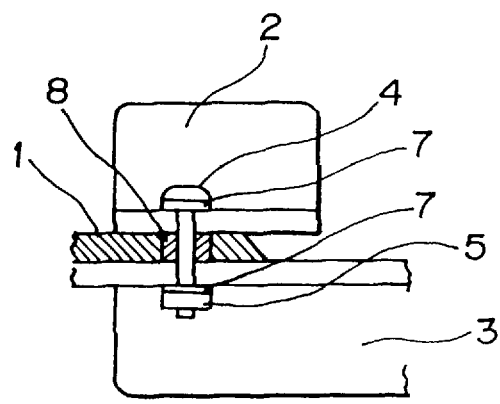
FIG. 4 is a sectional view showing a conventional thermoelectric cooling device in which screws are used for fixture together with impact absorbers.
Figure 5:
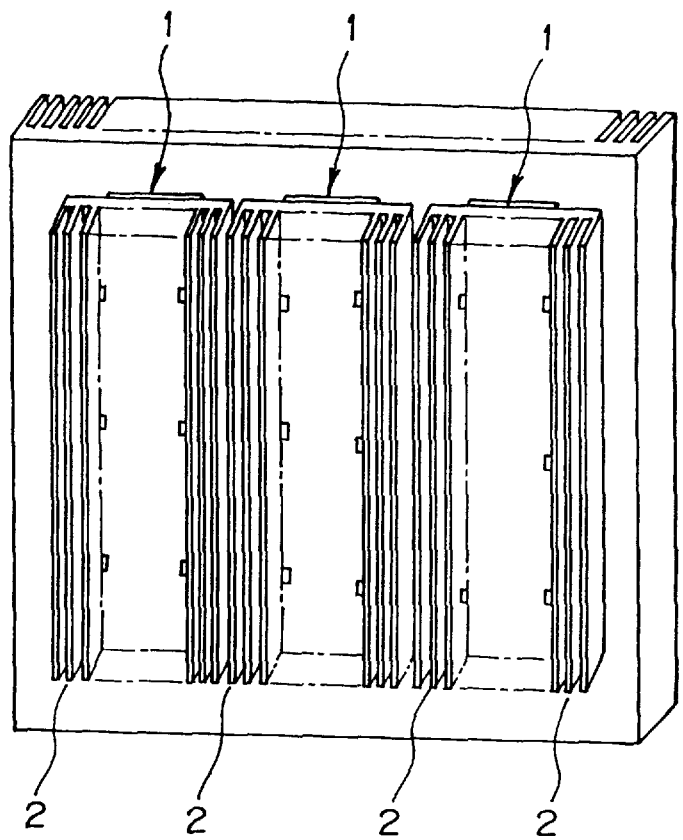
FIG. 5 is a perspective view showing a conventional thermoelectric cooling device using a plurality of thermoelectric modules.

In the conventional configuration shown in FIG. 1, the heat-absorbing fin member 2 and the radiating fin member 3 are spaced from each other by a height Hp of the thermoelectric module 1. Here, when it is assumed that the bottom area of the heat-absorbing fin member 2 is smaller than that of the radiating fin member 3, the opposing area between the two fin members is represented by Wfc×Lfc−Wp×Lp. At this moment, suppose that the air layer between the two fin members does not move, the heat transfer QL1 from the hot side to the cold side can be written as follows:

QL1=(λ/Hp)×(Tfh−Tfc)×(Wfc×Lfc−Wp×Lp), where λ indicates a thermal conductance of the air.

Figure 6:
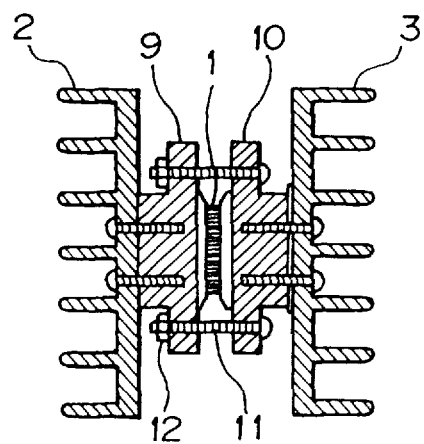
FIG. 6 is a sectional view showing a conventional thermoelectric cooling device using blocks.
Figure 7:
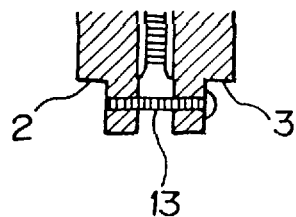
FIG. 7 is a partial sectional view showing a conventional thermoelectric cooling device in which blocks are fixed with bolts.
Figure 8:
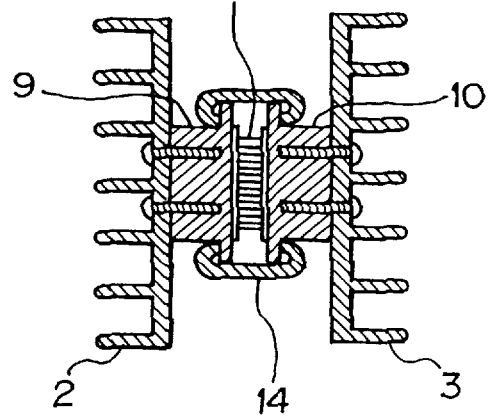
FIG. 8 is a sectional view showing a conventional thermoelectric cooling device with blocks pressed and fixed with pinch clamps.

As shown in FIG. 6, the heat-absorbing side block 9 and the radiating side block 10 are used, if it is assumed that the width and length of the blocks are equal to those of the thermoelectric module 1, the heat transfer QL2 may be written as follows:

QL2=(λ/(Hp+Hbc+Hbh))×(Tfh2−Tfc2)×(Wfc×Lfc−Wp×Lp), where Hbc is the height of the heat-absorbing side block 9 and Hbh is the height of the radiating side block 10.

Since the temperature Tfc2 of the heat-absorbing fin member 2 and the temperature Tfh2 of the radiating fin member 3 are determined respectively by considering the temperature gradient inside the block in question and contact heat-resistance between the fin member in question and the thermoelectric module 1; if QL2<QL1 should be realized, the block heights Hbc and Hbh are required to satisfy the following relation:

(Tfh2−Tfc2)/(Hp+Hbc+Hbh))<(Tfh−Tfc)/ Hp.

If each block has a sufficiently good thermal conductance, and the contact heat-resistance can also be neglected, or if it can be assumed that Tfh2=Tfh and Tfc2=Tfc, it is apparent that the heat transfer equivalent to the heights of the blocks can be reduced.

As the above method is similarly applied to the invention while Th is assumed to indicate the temperature of the module base 15, the heat transfer QL3 may be written as follows:

$$QL3 = (\lambda/(Hp + H)) \times (Th - Tfc) \times (1 - \beta) \times (Wfc \times Lfc - Wp \times Lp) + (\lambda/Hp) \times (Th - Tfc) \times \beta \times (Wfc \times Lfc - Wp \times Lp),$$

where β is a ratio of the opposing area (the partial area of the heat-absorbing fin member) to the module base 15 with the height Hp spaced, to the total area of the heat-absorbing fin member. If β is 1, the heat transfer quantity is equal to that of the configuration shown in FIG. 11. In the ideal condition or β is 0, QL3 is rewritten as follows:

QL3=(λ/(Hp+H))×(Th−Tfc)×(Wfc×Lfc−Wp×Lp)

In this condition, if QL3<QL1 should be realized, the following relation should hold:

(Th−Tfc)/(Hp+H)<(Tfh−Tfc)/ Hp.

That is, it is possible to reduce the heat transfer quantity equivalent to the height of the module base 15.

Next, a comparison will be made when the blocks are used. That is, a configuration is set up so that H can be replaced by Hbc+Hbh and the contact heat-resistance can be assumed to be neglected. In this assumption, Th−Tfc can be assumed as Tfh2−Tfc2, therefore QL3=QL2 holds. The thermal contact between the radiating fin member 3 and the thermoelectric module 1 is communicated through the contact area Lfh×(Wfh−W1) of the module base 15, whereas, when the aluminum blocks are used, the thermal contact is done through Lp×Wp. That is, it is obvious that the configuration of the present invention in which module base 15 is used is advantageous as to heat efficiency.

The radiating fin member 3 is fixed to the module base 15 in the flat bottom parts 15b and 15c using screws 18 or with bolts and nuts as to be fixing elements. The positions and the number of bolts are determined in consideration of the fixing strength.

Eight fixing bolts are required in total, four bolts for the fixture between the module base 15 and the hot-side radiating fin member 3, and four bolts for the fixture between the base 15 and heat-absorbing fin member 2. That is, it is possible to reduce the number of fixing bolts, as compared to the case where the aluminum blocks are used, resulting in improved productivity.

Thus, in accordance with the thermoelectric cooling device of the present invention, it is possible to reduce the amount of heat transfer by broadening the distance between the heat-absorbing fin member 2 and the radiating fin member 3 as has been done in the configuration using aluminum blocks. Still, the step of fixing blots is reduced while the structure can be formed simply by only bending the flat plate, to thereby realize the advantage that manufacturing is quite simplified.

Figure 11:
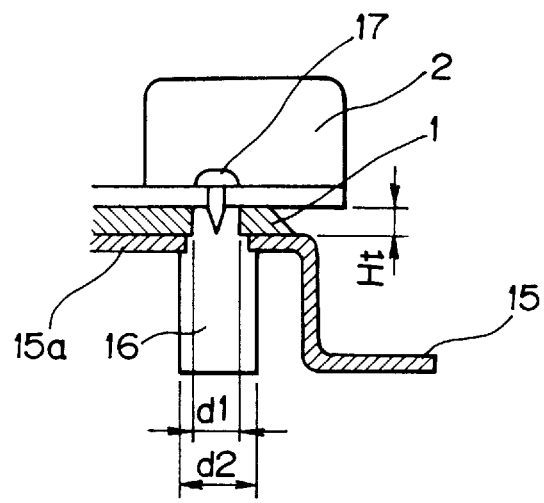
FIG. 11 is a partially enlarged view showing a screw fixture portion using an attaching member.

In order to prevent the thermal contact between the heat-absorbing side and the radiating side, attaching members are used as shown in FIG. 11. That is, an attaching member 16 made from Bakelite is provided in a site where a screw 17 is to be fixed for jointing the rectangular-portion 15a of the module base 15 and the heat-absorbing fin member 2. The material for the attaching member 16 is not limited to Bakelite. Any material can be used as far as it has low thermal-conductance and is hard, and brittle or resilient, such as a hard rubber or the like. The attaching member 16 has a smaller diameter portion in the upper part thereof. The rectangular-projected portion 15a of the module base 15 has holes each having a smaller diameter than an outside diameter d2 of the attaching member and a greater diameter than an outside diameter d1 of the upper small-diameter part. The height Ht of the upper small-diameter part of the attaching member 16 is equal to or smaller than the height of the thermoelectric module 1. The heat-absorbing fin member 2 is fixed to the upper small-diameter part with a screw 17. Positions and the number of the attaching members should be determined by considering the required fixing strength.

Since the attaching member 16 is made from a material having low thermal-conductance and since the screw does not come in contact with the module base, it is possible to inhibit heat transfer between the heat-absorbing fin member 2 and the module base 15, thus restraining heat transfer from the radiating fin member 3 to the heat-absorbing fin member 2. Since the attaching member 16 is formed of a material which is hard, and brittle or resilient, it is possible to protect the thermoelectric module 1 from being broken by impacts or damaged by the excessive force of fixture at the time of assembly.

In this embodiment, since the bottom area of the radiating fin member 3 is, in general, greater than that of the heat-absorbing fin member 2, the radiating side 1b of the thermoelectric module 1 is adapted to be in contact with the module base 15. However, the heat-absorbing side 1a may be adapted to be in contact with the module base 15.

Figure 12:
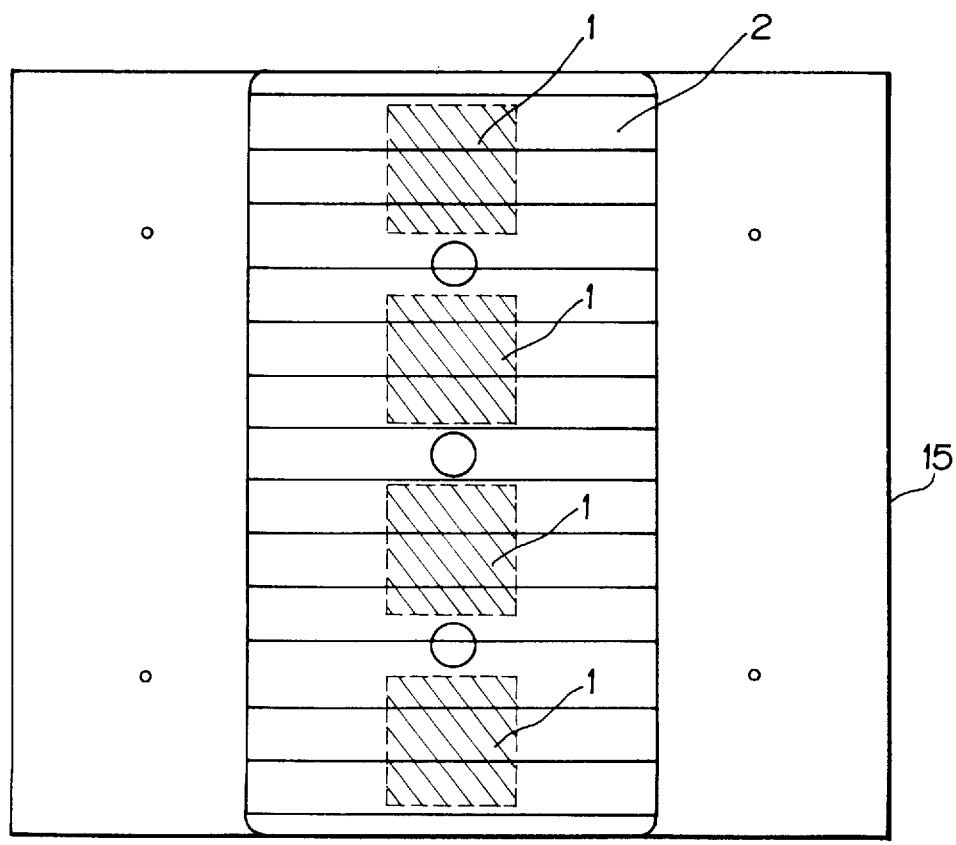
FIG. 12 is a sectional view showing an embodiment of a thermoelectric cooling device including a plurality of thermoelectric modules.

In view of the thermal efficiency, although the thermoelectric module 1 is preferably placed on the center portion of the rectangular-projected portion 15a of the module base 15 as shown in FIG. 10, it is not necessary to place it in the center, depending upon the requirement of the mounting or any other reasons. When a plurality of thermoelectric modules are used, the thermoelectric modules 1 can be arranged on the rectangular-projected portion as shown in FIG. 12, by considering distribution of heat.

Generally, it is preferable in view of the heat transmission, to make the widths W2 and W3 of the flat portion of the module base 15, equal to each other, the widths may be different if the arrangement of the thermoelectric device to be attached requires that.

Figure 13:
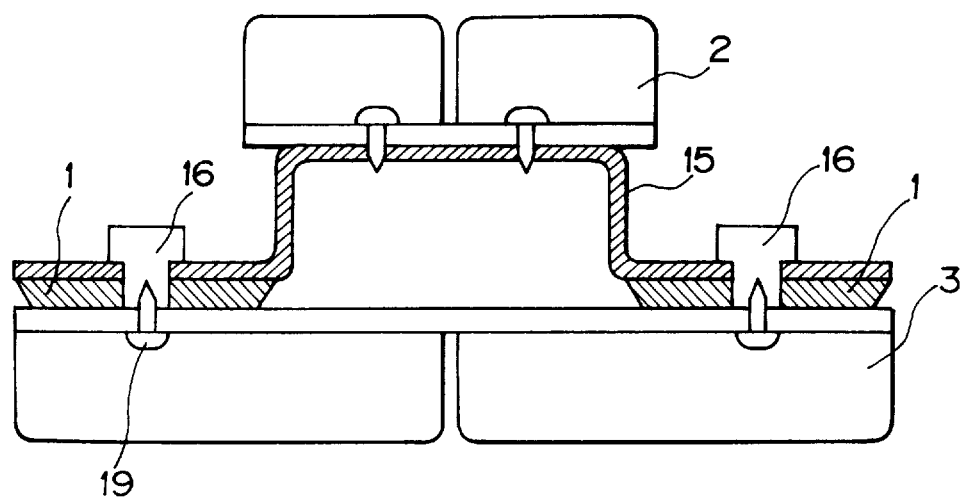
FIG. 13 is a sectional view showing an embodiment of a thermoelectric cooling device with a pair of thermoelectric modules attached to a flat portion of a module base.
Figure 14:
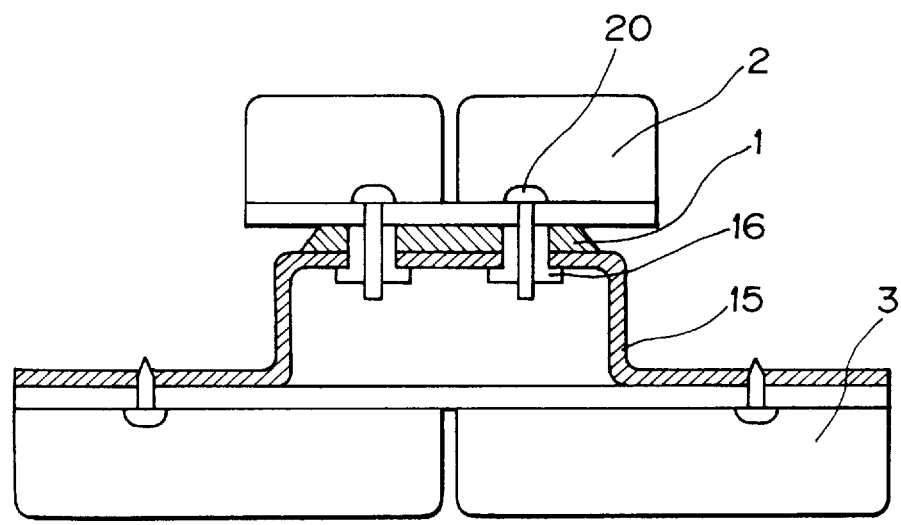
FIG. 14 is a sectional view showing an embodiment of a thermoelectric cooling device wherein attaching members are used to serve as fixing nuts.

As described in the conventional example with reference to FIG. 6, the attachment of the heat-absorbing fin member 2 to the module base 15 on the rectangular-projected portion 15a may be done by fixing screws, or bolts and nuts as fixing elements, without using any attaching member 16. The radiating fin member 3 may be fixed with screws to the bottom surface of the attaching members 16, as shown in FIG. 13. Although, in the configuration shown in FIG. 9, the attaching members 16 are made in contact with the radiating fin member 3, this contact is not necessary. Alternatively, as shown in FIG. 14, for example, it is also possible to make a structure in which bolts 20 are made to penetrate through respective attaching members by utilizing the attaching members like nuts.

Figure 15:
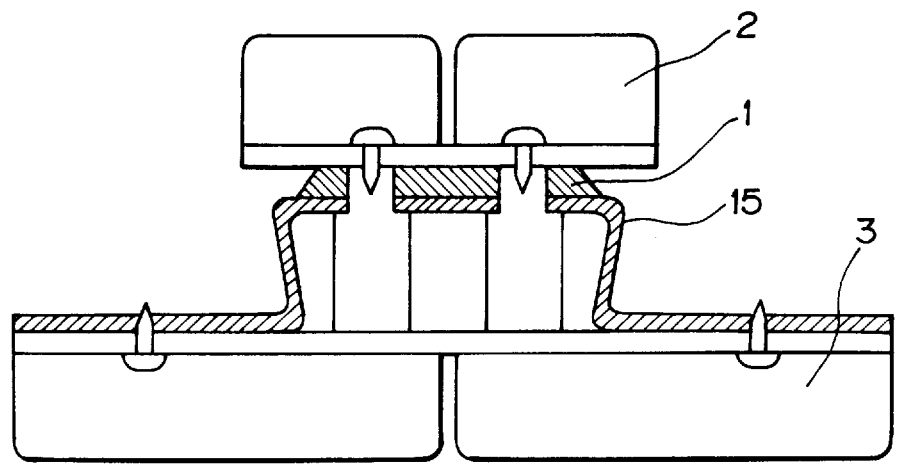
FIG. 15 is a sectional view showing an embodiment of a thermoelectric cooling device wherein bending portions of a module base are bent with a more acute angle.

Although the module base 15 is in the form of a rectangular-projected shape, it is also possible to bend the base plate with a more acute angle, as shown in FIG. 15. This configuration allows the module base 15 to absorb impacts more efficiently, resulting in increased reliability.

Figure 16:
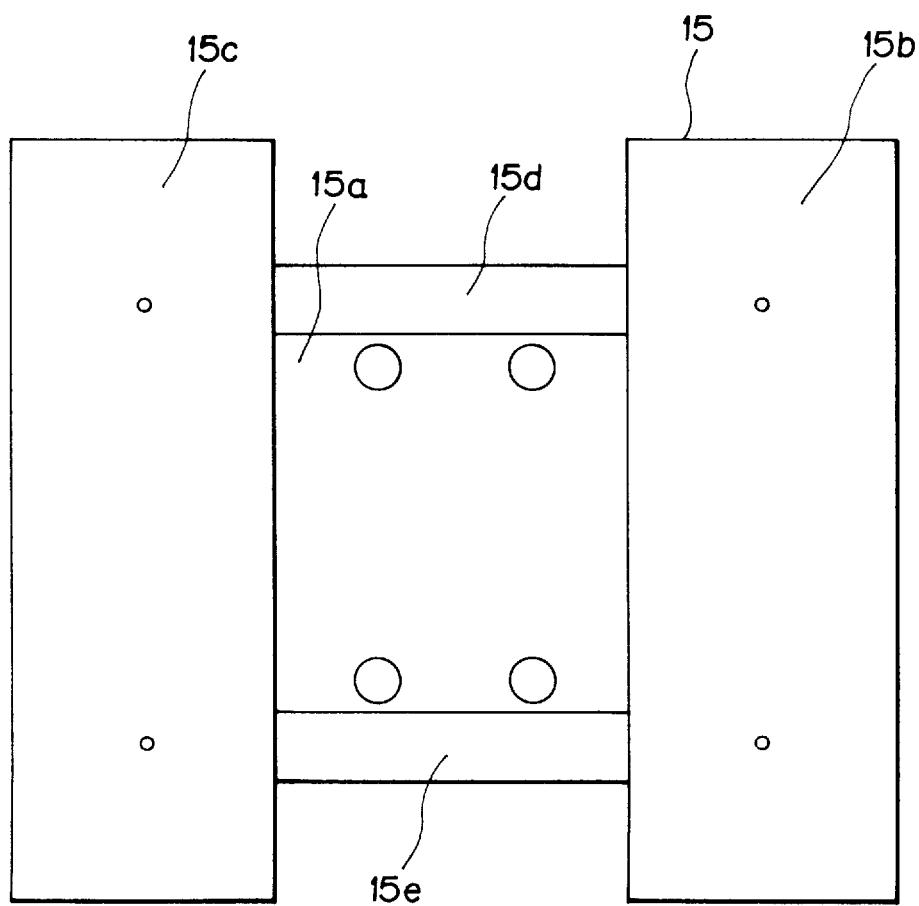
FIG. 16 is a top view showing an embodiment of a thermoelectric cooling device wherein a rectangular-projected portion is bent to bring the bent portions into contact with a radiating fin member.

In the invention, although the contact area of the module base 15 with the radiating fin member 3 is limited to the flat portion 15b and 15c as shown in FIG. 9, it is also possible to bend part of the rectangular-projected portion 15a as shown in FIG. 16 and bring thus bent flat area 15d and 15e into contact with the radiating fin member 3. This configuration is able to increase the contact area between the radiating fin member 3 and the module base 15. It is also possible to have the rectangular-projected portion 15a elongated along the direction of the bending edge so that the module base 15 has the same sectional form as shown in FIG. 9 on any sectional plane perpendicular to the bending edge. In this case, the opposing area between the heat-absorbing fin member 2 and the module base 15 becomes increased, therefore, heat transfer from the hot side to the cold side is increased, yet the manufacturing can be made easy.

In the description heretofore, a single thermoelectric module 1 is mounted on the rectangular-projected portion, it is also possible to mount a plurality of modules on the flat portion as shown in FIG. 13, by considering the dimensions of the heat-absorbing fin member 2 and the radiating fin member 3.

In the forgoing description of the embodiments, although the heat-absorbing fin member 2 is used as a cold-side heat-absorber while the radiating fin member 3 is used as a hot-side radiator, any other radiating and heat-absorbing elements can be used. For example, when this thermoelectric cooling device is applied to a liquid crystal display device, the back-light illuminator may be used as a heat-absorber. In a liquid crystal display device having a back-light illuminator, the back-light illuminator and liquid crystal panel are in close contact with each other, therefore the temperature of the liquid crystal panel is elevated by the heat emitted from the back-light illuminator and the heat which generates inside the liquid crystal panel from light from the illuminator. When the liquid crystal display device is used in high-temperature surroundings, the temperature of the liquid crystal panel exceeds its maximum heat-resistant temperature, thus degrading the liquid crystal panel. To deal with this, a fan is used to promote radiation of heat in order to inhibit the temperature rise, but there is a limit to this measure or the capability of air-cooling. There is a method proposed in which a cooling vessel having a radiating elements with a cooling liquid sealed therein is provided between the back-light illuminator and the liquid crystal panel. However, since this method involves risk of liquid spillage and degradation of optical characteristics, this method has hardly been put into practice.

Figure 17:
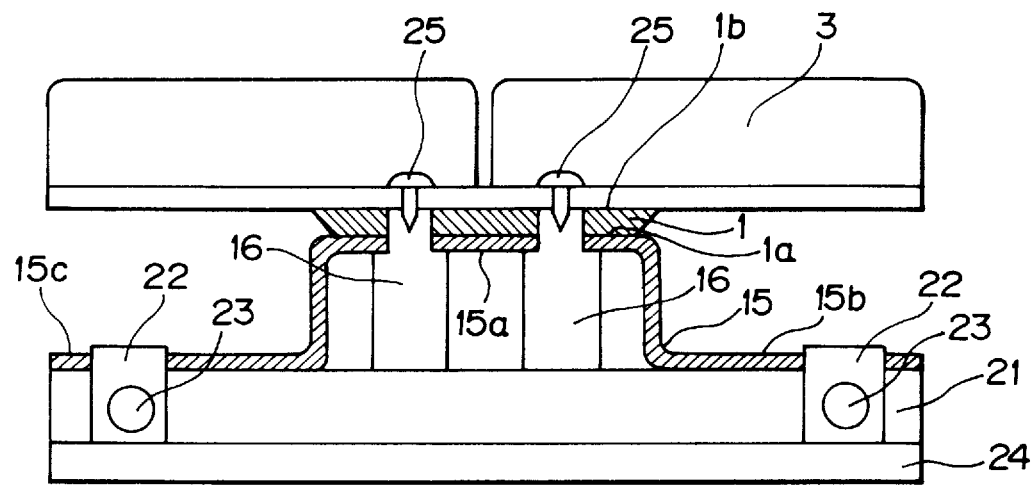
FIG. 17 is a sectional view showing an embodiment of a thermoelectric cooling device used in a liquid crystal display device.

To achieve the above purpose, a thermoelectric module 1 is used to cool the rear side of a back light illuminator 21 as shown in FIG. 17. That is, the thermoelectric cooling device is disposed in contact with the back light illuminator 21. The back light illuminator 21 as a heat-emitter is tightly fixed to a module base 15 of aluminum with 2 mm in thickness, using a pair of bands 22 with screws 23, whereby the illuminator 21 is brought into close contact with flat portions 15b and 15c having an identical width. The width and length of the back light illuminator 21 are equal to those of the module base 15. The rectangular-projected portion 15a of the module base 15 is in close contact with the cold side 1a of 40 mm square of the thermoelectric module 1. The hot side 1b is in contact with hot-side radiating fin member 3. The radiating fin member 3 is fixed to the module base 15 with screws 25 through attaching members 16. Two attaching members 16 are fixed spaced 6 mm from the side edge of the thermoelectric module 1 on each side along the longitudinal direction. Each attaching member 16 has such a height that the bottom thereof is in contact with the back light illuminator 21. With this arrangement, it is possible for the thermoelectric module 1 to effectively cool a liquid crystal panel 24 by the functions of the invention, without greatly changing the structure of the back light illuminator 21.

Figure 18:
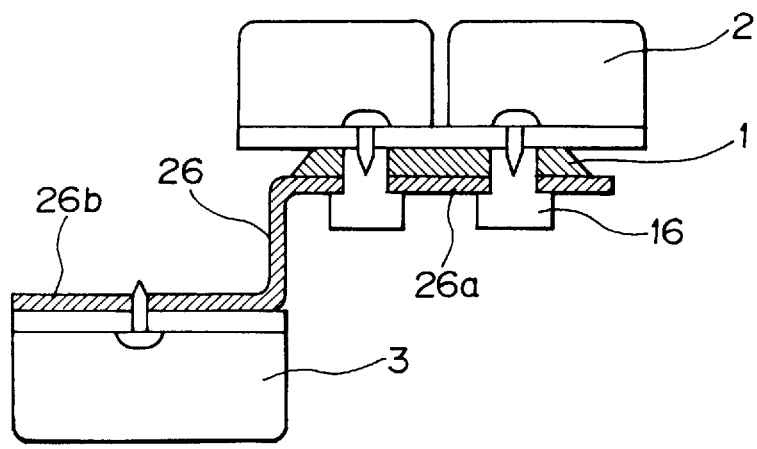
FIG. 18 is a sectional view showing an embodiment of a thermoelectric cooling device using a module base of Z-shape in section.

In the above embodiment, although the module base 15 in the form of the rectangular-projected shape is used, it is possible to use a module base 26 of Z-shape in section as shown in FIG. 18. In this case, the thermoelectric module 1 may be fixed either on flat portion 26a or 26b in a similar fixing manner as described in the above embodiment. In a case where the sizes of the heat-absorbing fin member and the radiating fin member are almost the same, the configuration of this geometry, in place of the rectangular-projected module base, is able to produce the same effect, and yet it is possible to reduce the number of bending sites of the module base, to thereby improve the manufacturing performance.

Figure 19:
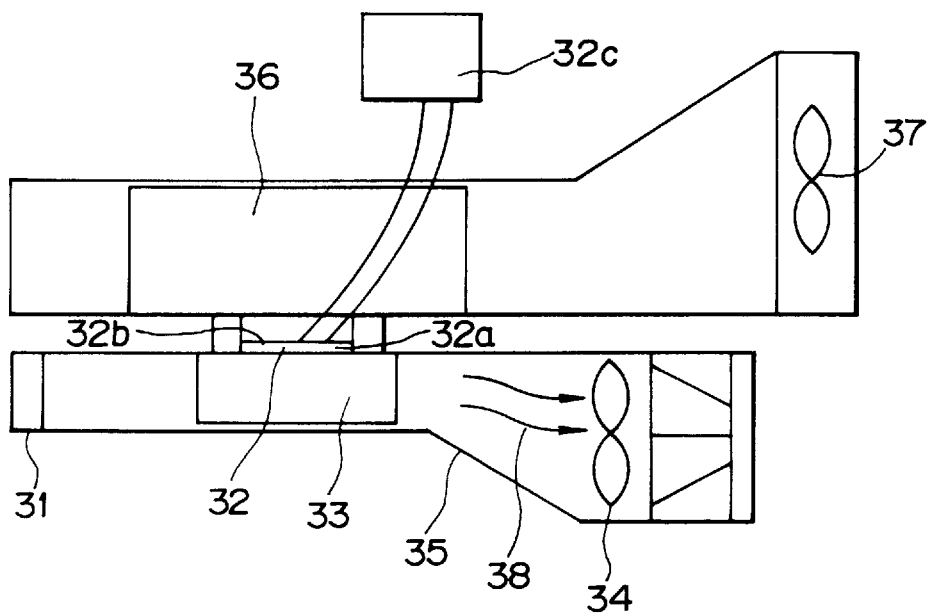
FIG. 19 is a constructional view showing a first embodiment of a thermoelectric cooling system of a liquid crystal projector in accordance with the invention.

FIG. 19 is a constructional view showing a first embodiment of a thermoelectric cooling system of a liquid crystal projector in accordance with the invention. A filter 31 disposed in the vicinity of the inlet port for the outside air is to prevent dust and dirt from entering and therefore adhering to a heat-absorbing fin unit 33 and optical elements to be cooled. The outside air is drawn in through the filter 31 by a cooling fan 34 and is cooled by the heat-absorbing fin unit 33 as passing through a duct 35, thus providing cooled air 38. The heat-absorbing fin unit 33 is heat-conductively joined to a cold-side face 32a of a Peltier element 32, which is supplied from a d.c. power source 32c and absorbs heat through the cold-side face 32a and radiates heat through a hot-side face 32b. Here, the hot-side face 32b is heat-conductively jointed to a radiating fin unit 36 for radiating heat. The heat radiated from the fin unit 36 is forcibly cooled and carried away by the drawn air by a radiating-side fan 37 to the outside.

Figure 20:
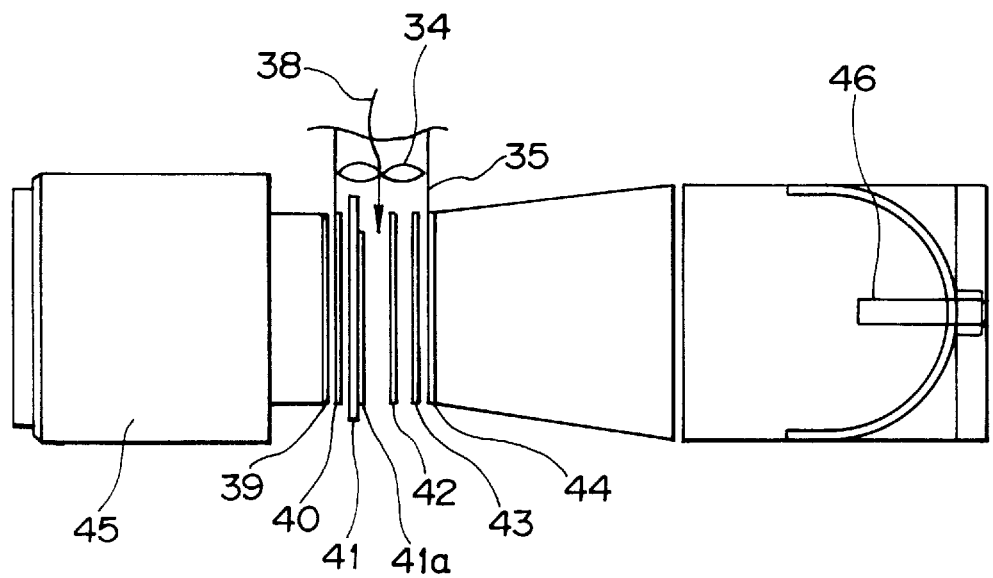

The cooled air 38 is introduced into the optical element arrangement shown in FIG. 20. The optical element arrangement includes a Fresnel lens 39, a light-outgoing side polarizing plate 40, a liquid crystal panel 41, a microlens 41a, a light-incident side polarizing plate 42, dimple-shaped lens 43, a UV-IR filter 44, a projecting lens 45, a projecting lamp 46. The liquid crystal 41 has a maximum heat-resistant temperature of about 60° C., whereas the light-incident side polarizing plate 42 has a maximum heat-resistant temperature of about 70° C. Although the polarizing plate 42 has a greater tolerable temperature, the plate 42 emits some or several times as much heat as the liquid crystal panel 41 does. Therefore, the polarizing plate 42 as well as the liquid crystal panel 41 requires sufficient cooling. Particularly, since the light-incident side polarizing plate 42 emits a great amount of heat, it is necessary to send cooled air 38 between the polarizing plate 42 and the dimple-shaped lens 43. Since the system can be cooled with better efficiency if a space between the dimple-shaped lens 43 and the UV-IR filter 44, both disposed near to the high-temperature projecting lamp, is also cooled, the UV-IR filter 44 is used as a side-wall of the cooling duct inside the optical system. In a system in which the light-incident side polarizing plate 42 emits a less amount of heat, the dimple-shaped lens 43 or the incident polarizing plate 42 is used as a side-wall defining the cooling duct.

As will be stated hereinafter, there is a configuration in which the light-incident side polarizing plate 42 or the liquid crystal panel 41 is used as a wall defining the cooling duct inside the optical system while one side of the light-incident side polarizing plate 42 or the whole light-incident side polarizing plate 42 and one side of the liquid crystal panel 41 are cooled by another cooling system. Further, the outgoing side polarizing plate 40 which emits very little heat may be used as another side cooling duct wall. The heat emitted from the outside wall is very little so that it can be dissipated through natural convection or by branched flow from a cooling fan (not shown) for projector lamp. In this way, the use of the components inside the optical system as duct walls, makes it possible to limit the temperatures of the liquid crystal panel 41 and the light-incident side polarizing plat 42 to a designated temperature or less.

Figure 21:
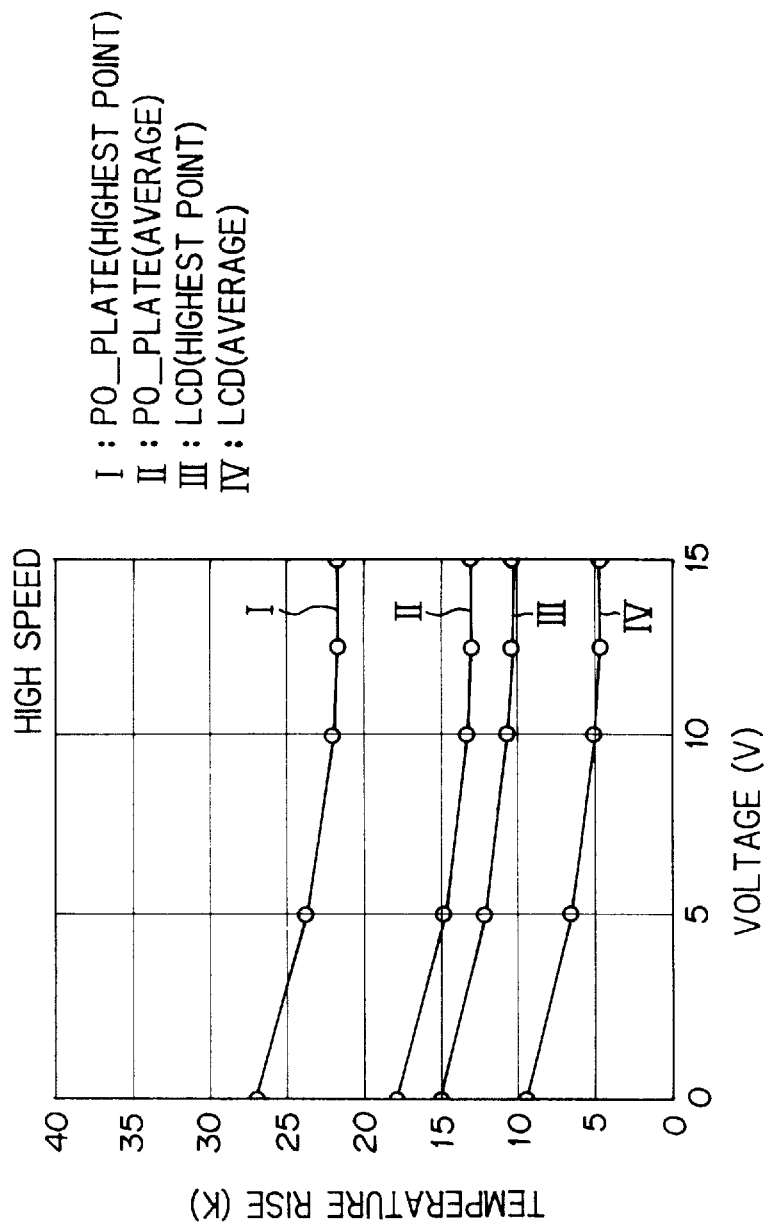
FIG. 21 is a graph showing temperature elevation on a light-incident side polarizing plate and a liquid crystal panel in the thermoelectric cooling system of the first embodiment.

FIG. 21 shows experimental result of the cooling system. In the air-cooling type cooling system with no Peltier element, the experimental result was that the maximum temperature of the light-incident side polarizing plate is 25.7° C.; the average temperature of the light-incident side polarizing plate is 18.3° C.; the maximum temperature of the liquid crystal panel is 15.2° C.; and the average temperature of the liquid crystal panel is 10.5° C. From the graph in FIG. 21, it is apparent that the effect of cooling becomes improved as the input voltage to the Peltier element is increased, in comparison with the air-cooling type configuration (when the input voltage is zero).

Figure 22:
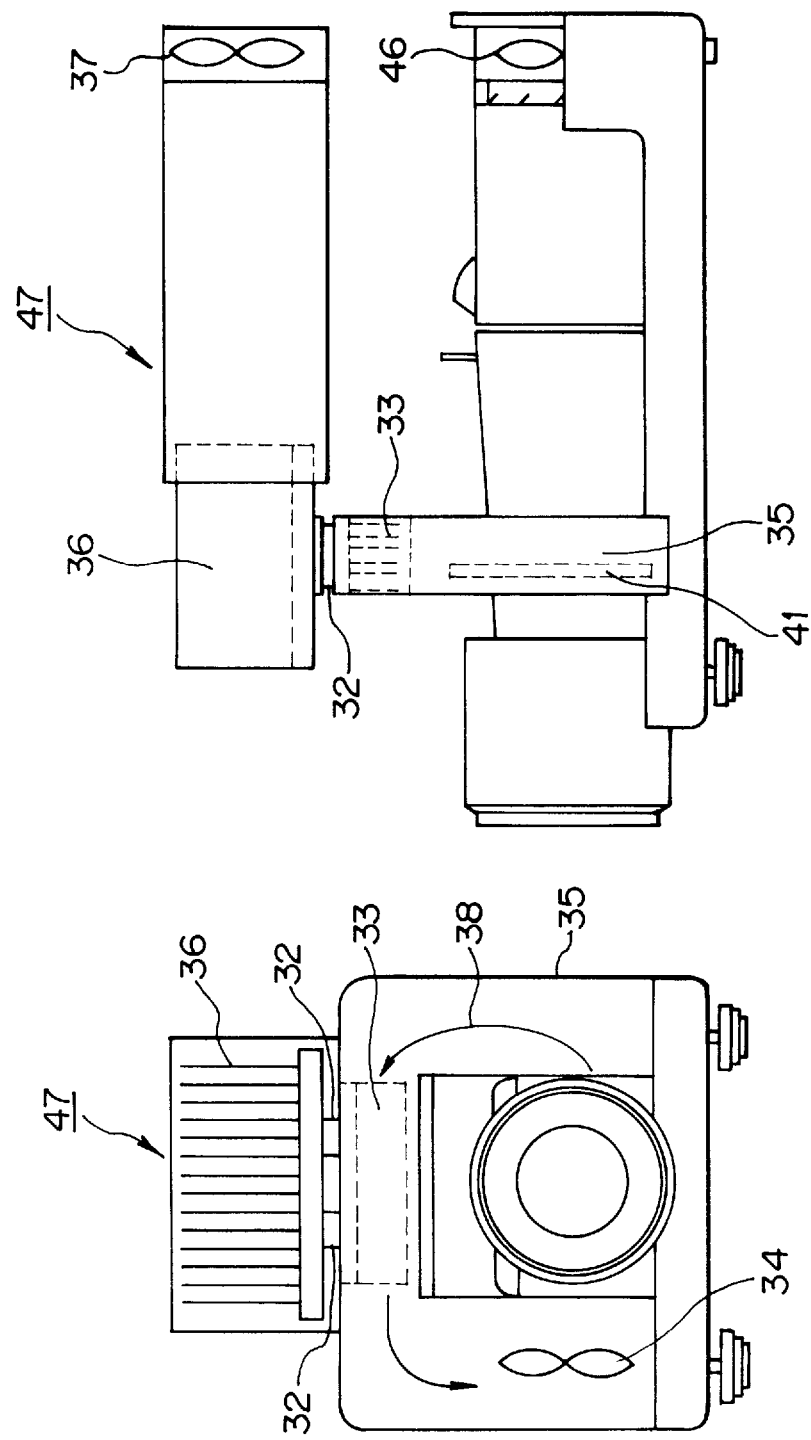
FIG. 22 is a constructional view showing a second embodiment of a thermoelectric cooling system of a liquid crystal projector in accordance with the invention.

FIG. 22 is a constructional view showing a second embodiment of a thermoelectric cooling system for a liquid crystal projector in accordance with the invention. Air from a liquid crystal panel 41 is guided through a cooling duct 35 into the air-inlet port of a heat absorbing fin unit 33, where the inlet air is cooled to discharge cooled air 38, which is circulated inside the optical system by a fan 34. This arrangement does not need any filter 31, and yet it is possible to effect cooling without allowing the dust to adhere to the surface of the liquid crystal panel 41.

Figure 23:
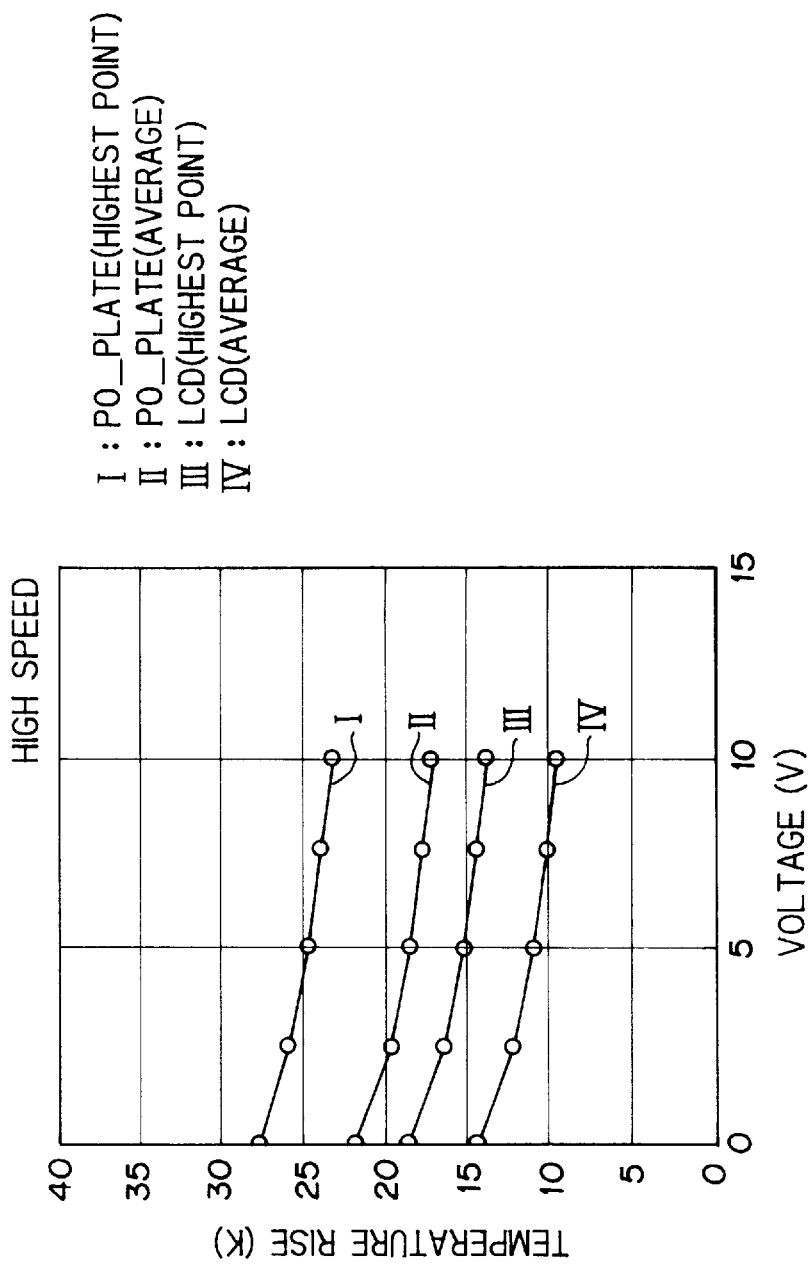
FIG. 23 is a graph showing temperature elevation on a light-incident side polarizing plate and a liquid crystal panel in the thermoelectric cooling system of the second embodiment.

FIG. 23 shows experimental result of this confined type cooling system. In this case, it is also apparent that the effect of cooling becomes improved as the input voltage to the Peltier element is increased, in comparison with the air-cooling type configuration (when the input voltage is zero).

Figure 24:
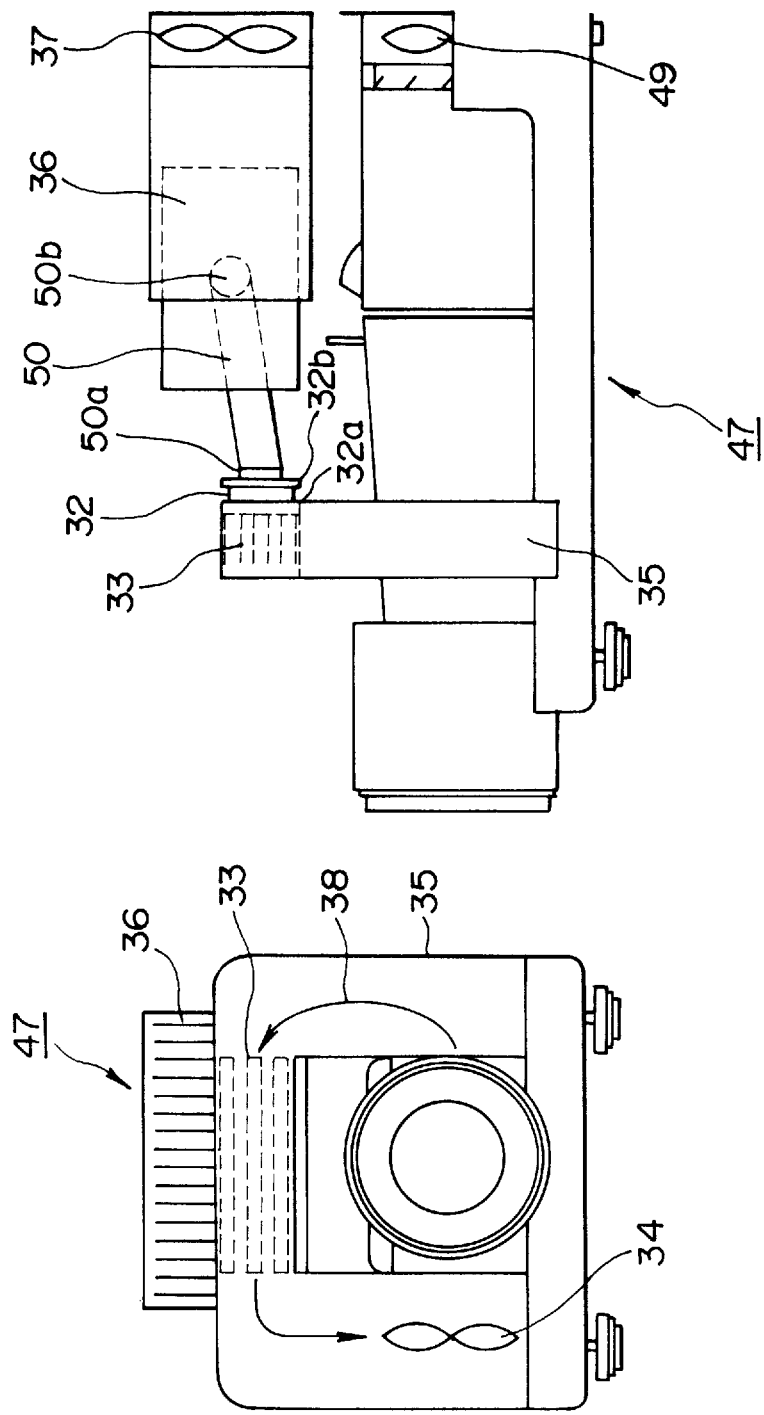
FIG. 24 is a constructional view showing a third embodiment of a thermoelectric cooling system of a liquid crystal projector in accordance with the invention.

FIG. 24 is a constructional view showing a third embodiment of a thermoelectric cooling system for a liquid crystal projector in accordance with the invention. A vaporizing portion 50a of a heat pipe 50 is heat-conductively joined to a hot-side face 32b of a Peltier element 32. As well-known, a volatile coolant is charged inside the heat pipe 50. The coolant, as receiving heat from the hot-side face 32b, is conveyed to a condensing portion 50b where the coolant condenses while discharging heat through a radiating fin unit 36. Use of a heat pipe 50 having an extremely small thermal resistance, increases the freedom of positioning the radiating fin unit 36. That is, the radiating fin unit 36 can be mounted in the most convenient position for radiating heat, thus it is possible to attain effective cooling. As compared to the second embodiment shown in FIG. 22, the provision of the heat pipe 50 makes it possible to lower the position of the radiating fin unit 36, whereby the total height of the cooling system can be reduced. In consequence, it is possible to downsize the liquid crystal projector.

Figure 25:
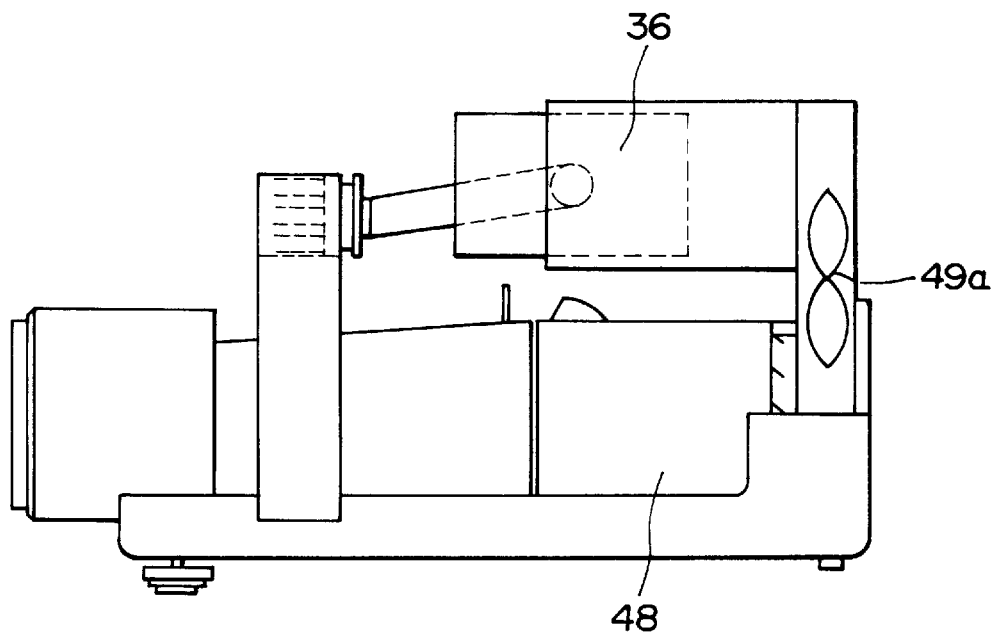
FIG. 25 is a constructional view showing a variation of the third embodiment in which the system is made compact by using a heat pipe.

FIG. 25 shows a variation of the embodiment as above. As the height of the radiating fin unit 36 is lowered, it becomes possible to use a common cooling fan 49a which serves as both the radiating fan and the cooling fan for the projecting lamp 46 inside the projecting lamp house 48. This configuration is able to reduce not only the power consumption but also the noise level of the system.

Figure 26:
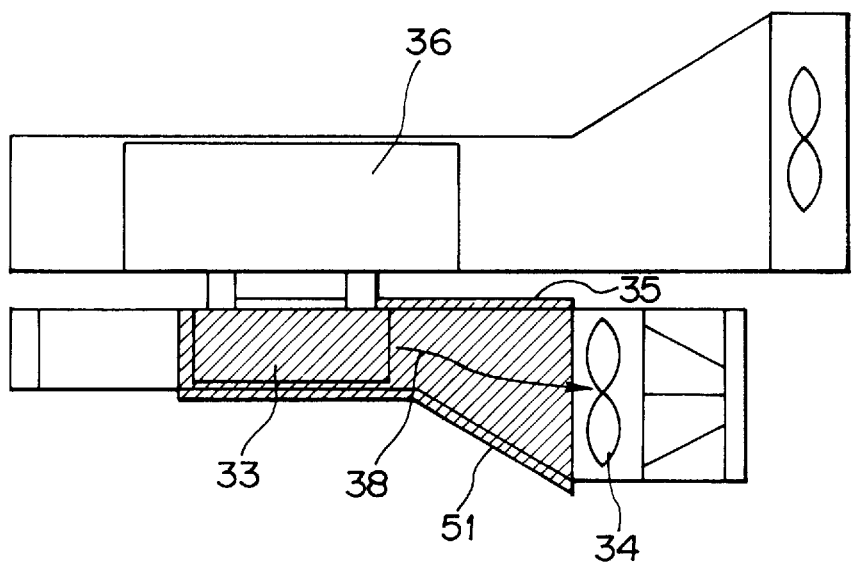
FIG. 26 is a constructional view showing a fourth embodiment of a thermoelectric cooling system of a liquid crystal projector in accordance with the invention.

FIG. 26 is a constructional view showing a fourth embodiment of a thermoelectric cooling system for a liquid crystal projector in accordance with the invention. Air entering the heat-absorbing fin unit 33 is cooled down to the temperature of the outside air and discharged as cooled air 38. In order to prevent the cooled air 38 from being heated, a heat-insulator 51 is provided on a cooling duct 35 between the heat-absorbing fin unit 33 and the cooling fan 34. This configuration contributes to increased efficiency of cooling. Since the cooling fan 34 itself is a heat-emitter and since the entrance to the liquid crystal panel is heated to high temperatures due to the heat from the projecting lamp, it is better not to insulate around these parts. As alternative configurations, the same effect can be obtained by increasing the thickness of the cooling duct 35 or reducing the distance of the cooling duct 35 between the heat-absorbing unit 33 and the cooled objects, that is, the liquid crystal panel and the light-incident side polarizing plate.

As to the specifications of the cooling duct 35 of the cooling system written in the second embodiment, in the case where the air flow of the cooled air 38 is sufficiently strong, the cooled air 38 around the entrance to the liquid crystal panel 41 and the light-incident side polarizing plate 42, has a temperature as high as that of the outside air around the cooling duct 35 and the cooled air 38 around the other portion has a higher temperature than the outside air around the cooling duct 35. In the thus set up product, in order to facilitate the cooling duct 35 to radiate heat to the air around the cooling duct, radiating fins can be formed on the cooling duct 35. Alternatively, it is also possible to make thickness of the cooling duct 35 thin. This configuration contributes to increased efficiency of cooling. In contrast, in the case where the air flow of the cooled air 38 is weak, the temperature of the cooled air 38 around the portion between the heat-absorbing fin unit 33 and the cooled objects such as the liquid crystal panel 41 and the light-incident side polarizing plate 42, is lower than the that around the cooling duct 35. In the thus set up product, it is possible, as stated above, to achieve increased efficiency of cooling by insulation of the cooling duct or reducing the length of the cooling duct to reduce the area of heat leakage.

Figure 27:
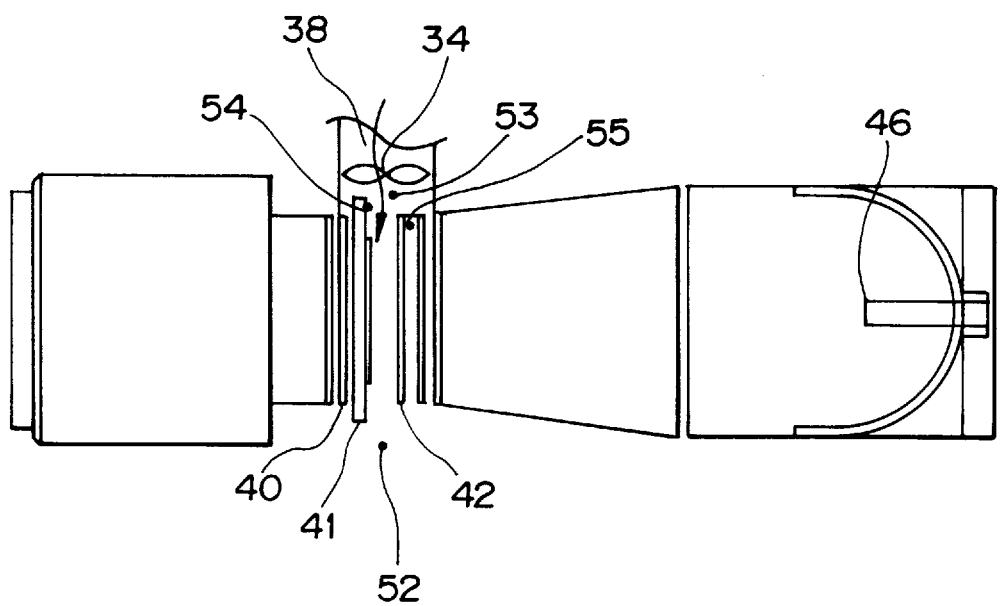
FIG. 27 is a constructional view showing a fifth embodiment of a thermoelectric cooling system of a liquid crystal projector in accordance with the invention.

FIG. 27 is a constructional view showing a fifth embodiment of a thermoelectric cooling system for a liquid crystal projector in accordance with the invention. In this embodiment, in order to detect air temperature, a first temperature sensor 52 is placed near the liquid crystal panel 41 and the light-incident side polarizing plate 42 on the outlet side of cooled air 38. In this configuration, the first sensor 5 detects the temperature of the cooled air 38, whereby the maximum temperature of the liquid crystal panel 41 and the light-incident side polarizing plate 42 can be estimated by the simple method. A second temperature sensor 53 is placed in the inlet port of the cooled air 38 near the heat-absorbing fin unit 33 to measure the temperature of the cooled air. The configuration including two sensors is able to detailedly estimate the maximum temperatures of the liquid crystal panel 41 and the light-incident polarizing plate 42. Alternatively, third and fourth temperature sensors 54 and 55 are disposed to detect the temperatures at edges, where the light does not pass by, of the liquid crystal panel 41 and the light-incident side polarizing plate 42. This configuration including two sensors 54 and 55 makes it possible to estimate the maximum temperatures of the liquid crystal panel 41 and the light-incident polarizing plate 42.

Figure 28:
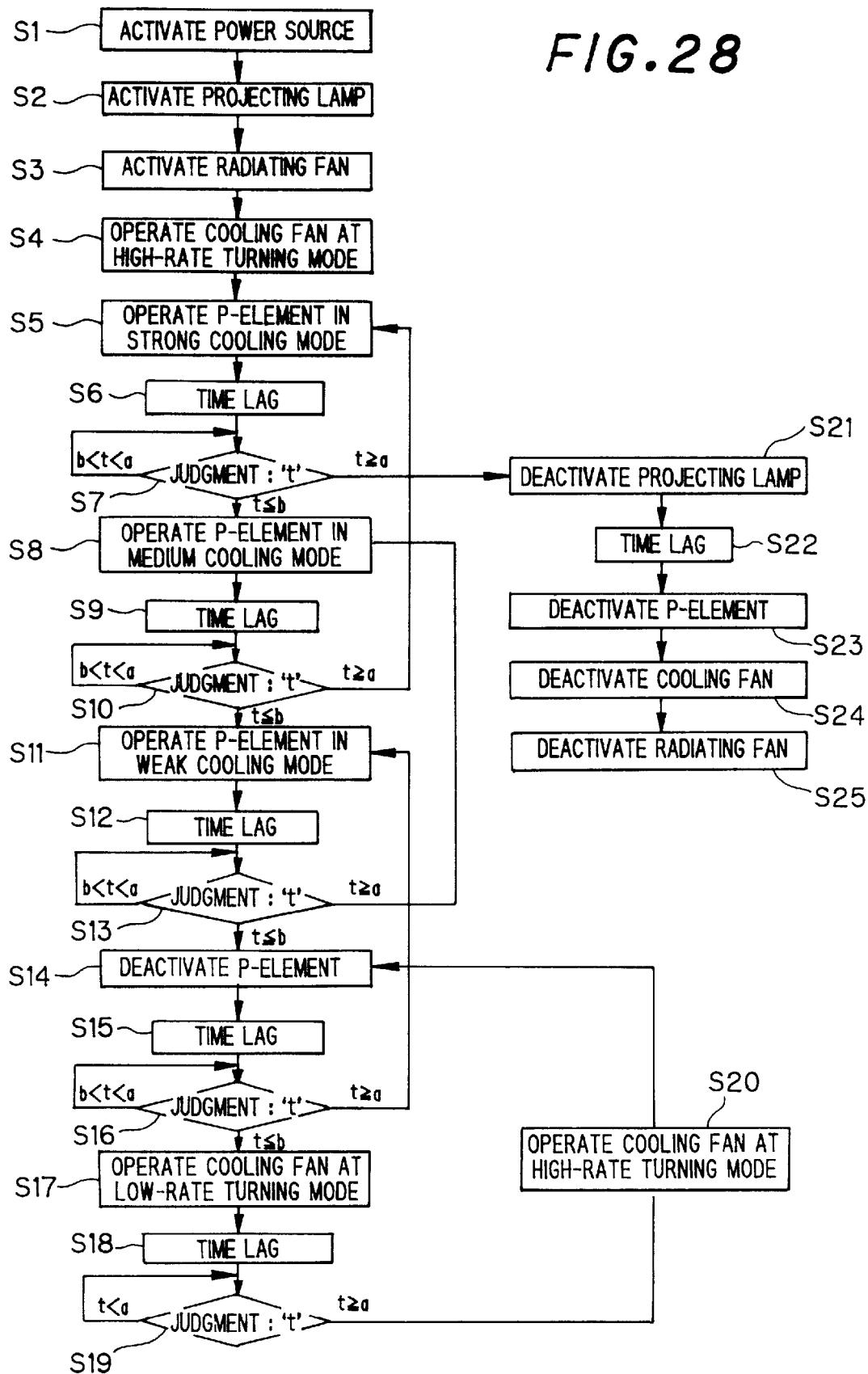
FIG. 28 is a flowchart showing a method of control in the fifth embodiment.

FIG. 28 is a flowchart showing a typical method of controlling the Peltier element 32, the cooling fan 34 and the radiating fan 37 to effect temperature control in the fifth embodiment.

For controlling these elements, it is possible to effect detailed control or to vary current values for different elements, in place of merely turning on and off the elements. In practice, however, most cases can be dealt with by the simple control. That is, in this description, the Peltier element 32 is controlled by turn-ON and turn-OFF while the ON-state has three kinds of modes, i.e., strong, medium and weak modes. The cooling fan 34 is controlled by turn-ON and turn-OFF while the On-state has two kinds of modes, i.e., high-rate and low-rate turning modes. The radiating fan is controlled merely by turn-ON and turn-OFF. An optimal controlling method is determined based on experiments, in accordance with the utility condition. As to temperature switches, when either the temperature of the liquid crystal panel 41 or the temperature 't' of the light-incident side polarizing plate 42 exceeds a maximum tolerable temperature 'a', a temperature switch A is adapted to operate. When both the temperature of the liquid crystal panel 41 and the temperature 't' of the light-incident side polarizing plate 42 become less than a certain determined temperature 'b', the system determines that the condition is excessively cooled and operates a temperature switch B.

As the power supply is turned on (Step S1), the projecting lamp 46 turns on (Step S2) and the radiating fan 37 turns on (Step S3). Then, the cooling fan 34 is activated in the high-rate turning mode (Step S4). The Peltier element 32 is activated in the strong cooling mode (Step S5).

After the passage of a predetermined time (Step S6), a temperature 't' of the liquid crystal panel 41 or of the light-incident side polarizing plate 42 is picked up to make a judgment (Step S7). If the measured temperature 't' is equal to or greater than 'a', the temperature switch A operates to turn the projecting lamp 46 off. Then, after the passage of a predetermined time (Step S22), the Peltier element 32 is turned off, and the cooling fan 34 and the radiating fan 37 are turned off (Steps S24 and S25). If the measured temperature 't' falls within a range of b<t<a, the measurement of temperature is repeatedly made. If the measured temperature 't' is not more than 'b', the temperature switch B operates to switch the operation mode of the Peltier element 32 into the medium cooling mode (Step S8).

After the passage of a predetermined time (Step S9), a temperature 't' is picked up to make a judgment (Step S10). If the measured temperature 't' is equal to or greater than 'a', the temperature switch A operates so that the system returns to Step S5 where the Peltier element 32 is changed into the strong cooling mode. If the measured temperature 't' falls within a range of b<t<a, the measurement of temperature is repeatedly made. If the measured temperature 't' is not more than 'b', the temperature switch B operates to switch the operation mode of the Peltier element 32 into the weak cooling mode (Step S11).

After the passage of a predetermined time (Step S12), a temperature 't' is picked up to make a judgment (Step S13). If the measured temperature 't' is equal to or greater than 'a', the temperature switch A operates so that the system returns to Step S8 where the Peltier element 32 is changed into the medium cooling mode. If the measured temperature 't' falls within a range of b<t<a, the measurement of temperature is repeatedly made. If the measured temperature 't' is not more than 'b', the temperature switch B operates to turn the Peltier element 32 off (Step S14).

After the passage of a predetermined time (Step S15), a temperature 't' is picked up to make a judgment (Step S16). If the measured temperature 't' is equal to or greater than 'a', the temperature switch A operates so that the system returns to Step S11 where the Peltier element 32 is changed into the weak cooling mode. If the measured temperature 't' falls within a range of b<t<a, the measurement of temperature is repeatedly made. If the measured temperature 't' is not more than 'b', the temperature switch B operates to switch the operation mode of the cooling fan 34 into the low-rate turning mode (Step S17)

After the passage of a predetermined time (Step S18), a temperature 't' is picked up to make a judgment (Step S19). If the measured temperature 't' is equal to or greater than 'a', the temperature switch A operates to switch the operation mode of the cooling fan 34 into the high-rate turning mode (Step S20) and the system returns to Step S14 where the Peltier element 32 is turned off. If the measured temperature 't' is less than 'a', the measurement of temperature is repeatedly made.

The flowchart shown in FIG. 28 is to achieve highly efficient cooling. In general, the power consumption of the Peltier element 32 is markedly higher than the power consumption of the cooling fan 34. Therefore, if the noise level is disregarded, the system can be operated at a high efficiency when the cooling fan 34 is operated at high-rate turning while the power consumption of the Peltier element 32 being inhibited. In the flow of control, the system is controlled as shown in FIG. 28 in such a manner that the Peltier element 32 and the cooling fan 34 are initially operated in the strong cooling mode and in the high-rate turning mode, respectively; and as the temperature switch B is operated, the cooling level of the system is lowered step by step in the order that the Peltier element 32 is changed successively into the medium cooling mode and the weak cooling mode, and then the cooling fan is changed into the low-rate turning mode. When the temperature switch A is operated, the cooling level of the system is raised in the reverse order. If the temperature switch A is operated when the system is in the maximum cooling mode, the projecting lamp 46 is turned off and after the passage of a predetermined time, the cooling system is turned off. A time lag in each cooling level, is provided to wait for the detected temperature to be stabilized. When the main appliance is energized, the cooling system is adapted to operate in the maximum cooling mode. This is to avoid the following situation: Consider a case where the cooling system starts to operate in, for example, the minimum cooling mode when the main appliance is activated. In such a case, if the appliance is operated at a quite high-temperature atmosphere, it takes rather long time to cause the temperature switch A to continuously change the cooling mode from the minimum to the maximum, since the cooling control has delay due to the aforementioned time lags and other factors. That is, by the above configuration, it is possible to avoid the temperature switch A from being continuously operated in a prolonged period of time due to the cooling control inclusive of time lags, if the appliance is operated at a high-temperature atmosphere.

Figure 29:
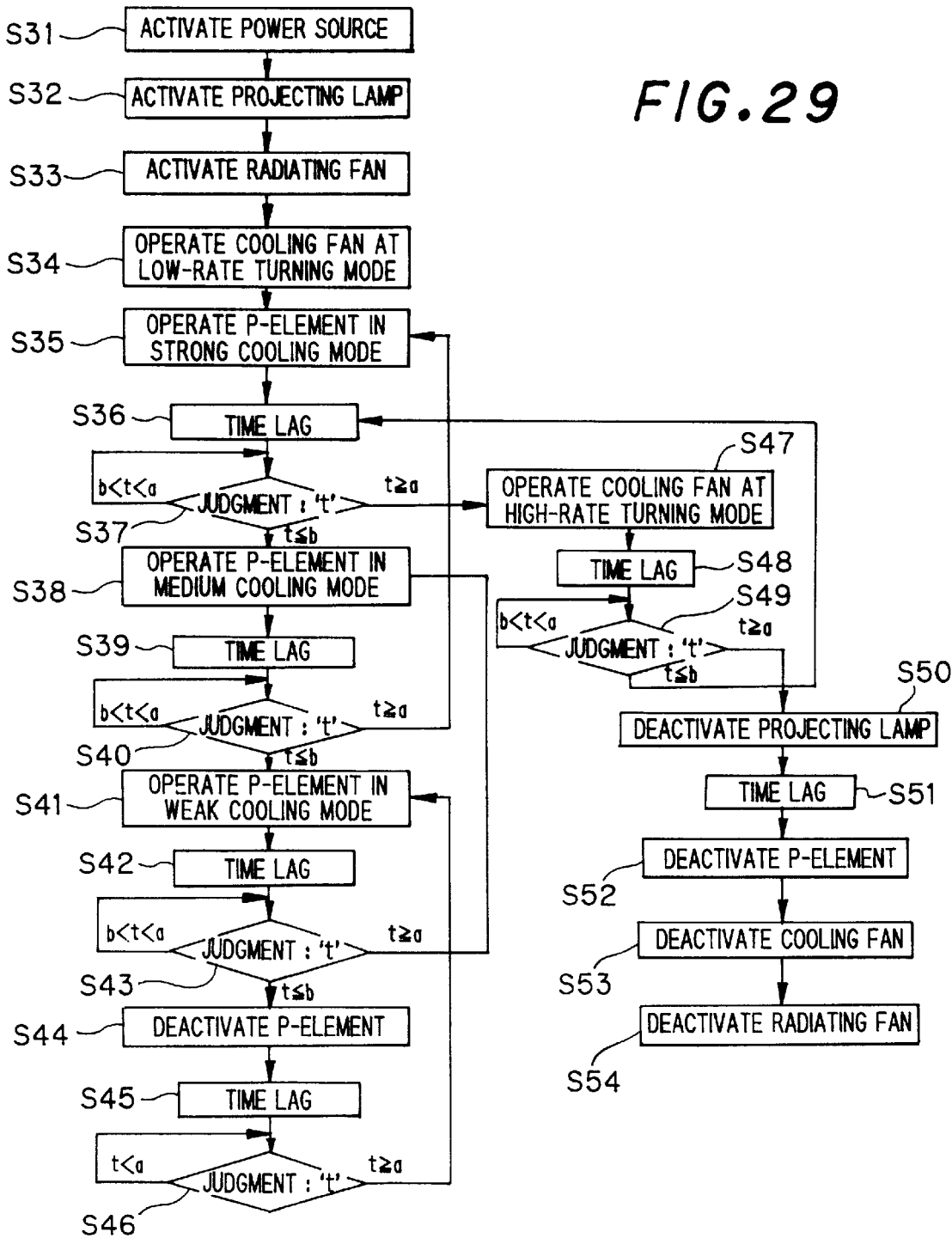
FIG. 29 is a flowchart showing another method of control in the fifth embodiment.

A flowchart shown in FIG. 29 is to realize a quiet-type cooling operation. The difference between this configuration from that shown in FIG. 28 is that when the cooling system is activated, the cooling fan 34 operates in the low-rate turning mode. When the temperature switch A is operated, the cooling fan 34 operates at high-rate turning. When the temperature switch B is operated, the cooling mode of the Peltier element 32 is lowered in the order of the medium cooling and the weak cooling.

As the power supply is turned on (Step S31), the projecting lamp 46 turns on (Step S32) and the radiating fan 37 turns on (Step S33). Then, the cooling fan 34 is activated in the low-rate turning mode (Step S34). The Peltier element 32 is activated in the strong cooling mode (Step S35).

After the passage of a predetermined time (Step S36), a temperature 't' of the liquid crystal panel 41 or of the light-incident side polarizing plate 42 is picked up to make a judgment (Step S37). If the measured temperature 't' is equal to or greater than 'a', the temperature switch A operates to change the operation of the cooling fan 34 into the high-rate turning mode (Step S47). Then, after the passage of a predetermined time (Step S48), a temperature 't' is picked up to make a judgment (Step S49). If the measured temperature 't' is equal to or greater than 'a', the projecting lamp 46 is turned off (Step S50). After the passage of a predetermined time (Step S51), the Peltier element 32 is turned off (Step S52), and the cooling fan 34 and the radiating fan 37 are turned off (Steps S53 and S54). If the measured temperature 't' falls within a range of b<t<a, the measurement of temperature is repeatedly made. If the measured temperature 't' is not more than 'b', the temperature switch B operates so that the system returns to the step S36.

If, at Step S37, the measured temperature 't' is not more than 'b', the Peltier element 32 is changed into the medium cooling mode (Step S38).

After the passage of a predetermined time (Step S39), a temperature 't' is picked up to make a judgment (Step S40). If the measured temperature 't' is equal to or greater than 'a', the temperature switch A operates so that the system returns to Step S35, where the Peltier element 32 is changed into the strong cooling mode. If the measured temperature 't' falls within a range of b<t<a, the measurement of temperature is repeatedly made. If the measured temperature 't' is not more than 'b', the temperature switch B operates so that the Peltier element 32 is changed into the weak cooling mode (Step S41).

After the passage of a predetermined time (Step S42), a temperature 't' is picked up to make a judgment (Step S43). If the measured temperature 't' is equal to or greater than 'a', the temperature switch A operates so that the system returns to Step S38 where the Peltier element 32 is changed into the medium cooling mode. If the measured temperature 't' falls within a range of b<t<a, the measurement of temperature is repeatedly made. If the measured temperature 't' is not more than 'b', the temperature switch B operates to turn the Peltier element 32 off (Step S44).

After the passage of a predetermined time (Step S45), a temperature 't' is picked up to make a judgment (Step S46). If the measured temperature 't' is equal to or greater than 'a', the temperature switch A operates so that the system returns to Step S41 where the Peltier element 32 is changed into the weak cooling mode. If the measured temperature 't' is less than 'a', the measurement of temperature is repeatedly made.

Figure 30:
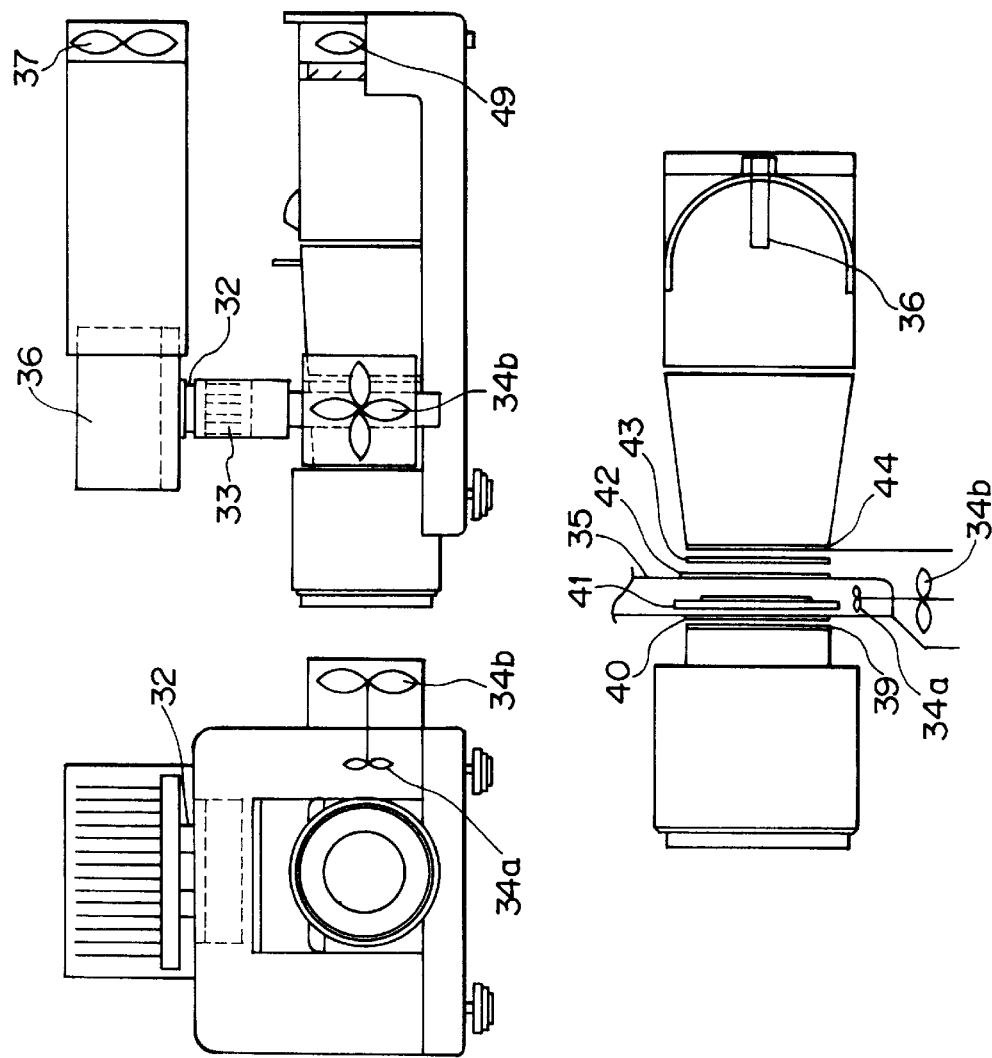
FIG. 30 is a constructional view showing a sixth embodiment of a thermoelectric cooling system of a liquid crystal projector in accordance with the invention.

FIG. 30 is a constructional view showing a sixth embodiment of a thermoelectric cooling system for a liquid crystal projector in accordance with the invention. In this embodiment, in order to reduce the power consumption of the Peltier element 32, the target of the optical elements to be cooled by the Peltier element 32 is limited to the liquid crystal panel 41 and one of the sides of the light-incident side polarizing plate 42, each of which has a rather low maximum heat-resistant temperature. Since the outgoing side polarizing plate 40 and the light-incident side polarizing plate 42 are used to define the air-flow passage for allowing the cooled air to pass therethrough, it is possible to reduce the cooling capacity of the Peltier element. Since the air-flow passage is made narrow, a highly static pressure type cooling fan should be used. In this embodiment, a cooling fan 34a for liquid crystal panel and another cooling fan 34b for light-incident side polarizing plate are driven by a coaxial single motor. Since the Peltier element 32 emits a considerably large amount of heat, particularly from the hot-side face 32b, two Peltier elements having a half of the totally required capacity for cooling are used and positioned so that the heat from the two may be uniformly conducted to the radiating fin unit 36.

Figure 31:
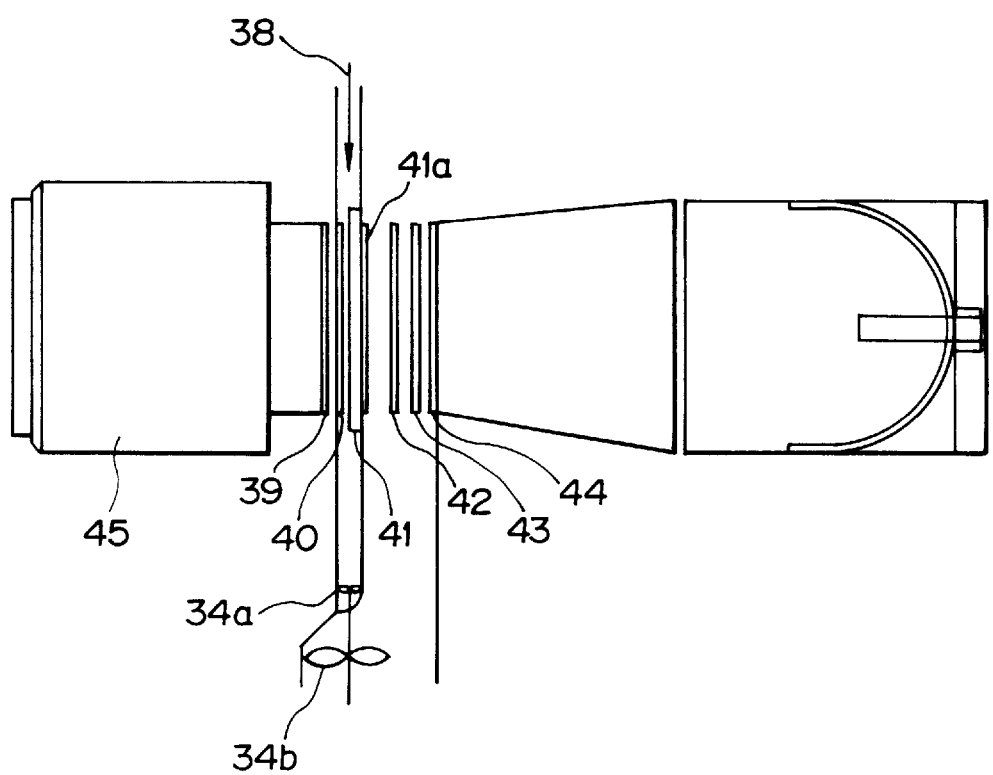
FIG. 31 is a constructional view showing a seventh embodiment of a thermoelectric cooling system of a liquid crystal projector in accordance with the invention.

FIG. 31 is a constructional view showing a seventh embodiment of a thermoelectric cooling system for a liquid crystal projector in accordance with the invention. Also in this embodiment, in order to reduce the power consumption of the Peltier element 32, the target of the optical elements to be cooled by the Peltier element 32 is limited only to the surface of the liquid crystal panel 41. Since, at the time of the operation, the light beams are focused on the surface of the liquid crystal panel 41, adhesion of fine dust and particles onto the microlens 41a does not cause a big problem. That is why only the liquid crystal panel 41 is cooled inside a confined structure by the Peltier element 32. In this case, although a great amount of heat is emitted, all the heat emission from the light-incident side polarizing plate 42 having a high maximum-resistant temperature is cooled by the air taken from the outside. As a result, it is possible to reduce the power consumption of the Peltier element 32 by a considerably large amount.

Figure 32:
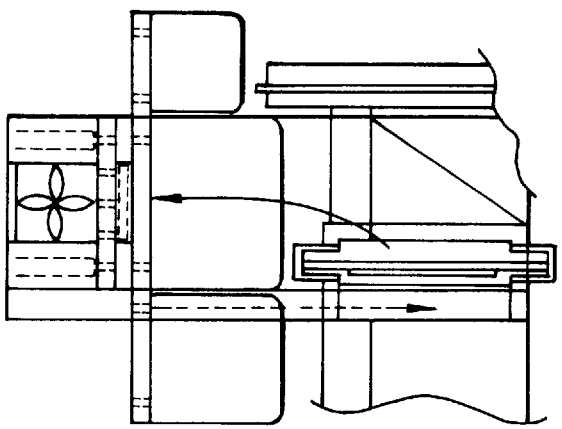
FIG. 32 is a constructional view showing an eighth embodiment of a thermoelectric cooling system of a liquid crystal projector in accordance with the invention.
Figure 32:
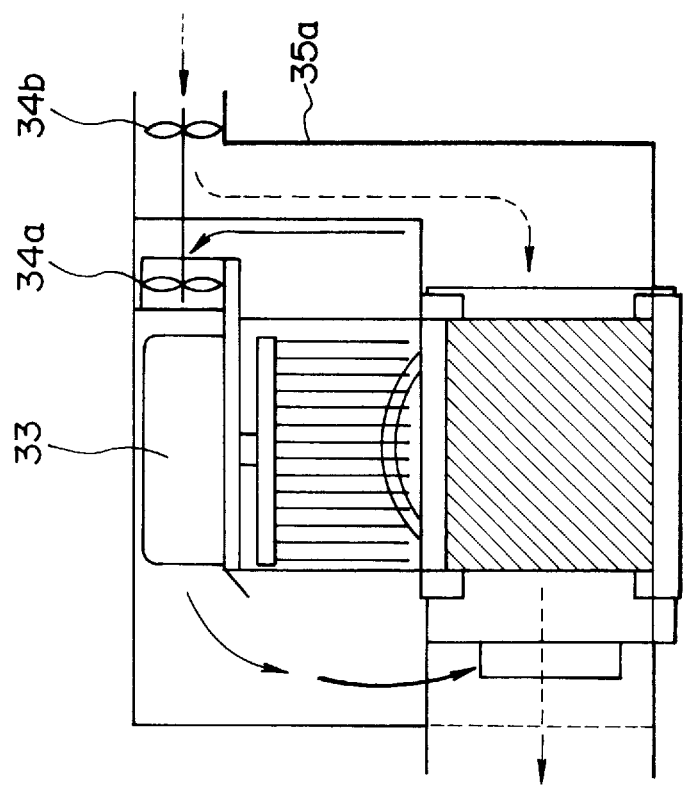

FIG. 32 is a constructional view showing an eighth embodiment of a thermoelectric cooling system for a liquid crystal projector in accordance with the invention. In the embodiments heretofore, the cooling fan 34a is placed at the side of the narrow space between the liquid crystal panel 41 and the light-incident side polarizing plate 42. In this embodiment, the cooling fan 34a is mounted on the upper side near the heat-absorbing fin unit. Therefore, it becomes possible to mount a large-sized fan so as to increase the air-flow amount, resulting in improved cooling capacity. Another fan 34b for cooling light-incident side polarizing plate is able to sent an air-flow through a duct 35a for light-incident side polarizing plate so as to cool the outside face of the light-incident side polarizing plate 42.

Figure 33:
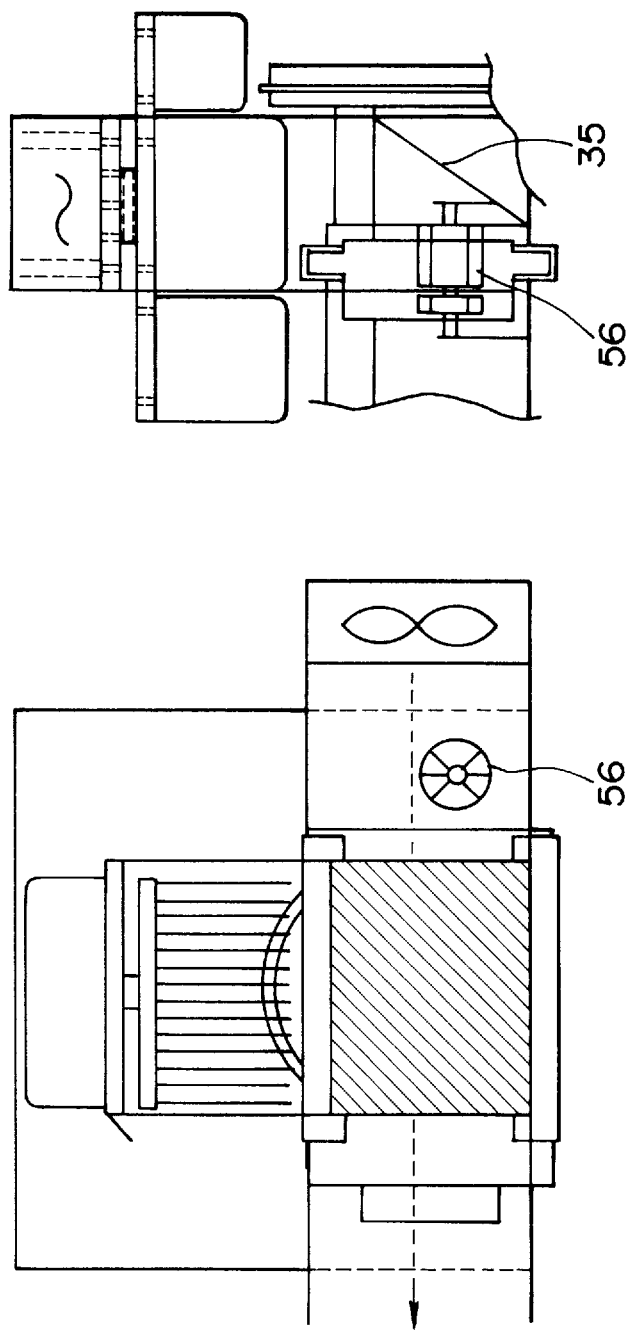
FIG. 33 is a constructional view showing a ninth embodiment of a thermoelectric cooling system of a liquid crystal projector in accordance with the invention.

FIG. 33 is a constructional view showing a ninth embodiment of a thermoelectric cooling system for a liquid crystal projector in accordance with the invention. In the embodiment, in place of using a coaxial fan, the air-flow for cooling the light-incident side polarizing plate is used to turn a vane wheel 56, which in turn has a coaxial fan to circulate the air inside the cooling duct 35.

In the thermoelectric cooling system stated in the second embodiment, it is most economic if the air with water and dust removed is used for the cooled air. It is possible to realize improved efficiency of cooling when a gas having a good thermal conductivity such as helium, neon and the like is used.

As apparent from the above description, the thermoelectric cooling device of the present invention is characterized by the use of the rectangular-projected module base made of a flat plate, between the thermoelectric module and the radiator or heat-absorber. This configuration makes it possible to improve the cooling performance and heat efficiency as well as contributes to simplifying the manufacture.

The module base can be used to establish a distance between the heat-absorber and the radiator, whereby heat transfer therebetween can be inhibited. Further, it is also possible to create a large contact area with the radiator, thus realizing a high heat-efficiency. Moreover, the fixing step can be reduced, to thereby improve manufacturing performance.

Since the attaching members are interposed between the module base and the heat-absorber or radiator and used to make fixture therebetween, it is possible to inhibit heat transfer from occurring through fixing elements such as bolts and the like. This configuration prevents the thermoelectric module from being broken by impacts or damaged by the excessive force of fixture.

Since the air drawn from the outside is cooled by the Peltier element and the thus cooled air is sent to the heat-emitting portions such as a liquid crystal panel and a light-incident side polarizing plate etc., it is possible to cool down the liquid crystal panel and the light-incident side polarizing plate to designated temperatures even if the outside temperature becomes high. The use of the cooled air reduces required amount of air-flow, thereby making it possible to reduce the noise level. Further, it is also possible to use a fine-mesh filter, the risk of adherence of dust can be reduced.

In place of drawing the outside air through the filter for removing dust, the air inside the cooling duct is used to be circulated. That is, the air from the outlet port near the liquid crystal panel and the light-incident side polarizing plate is guided into the air-inlet port of the heat-absorber where the air is cooled by the Peltier element so as to send the cooled air back to the liquid crystal and the polarizing plate etc. This arrangement makes it possible to cool down the liquid crystal panel and the light-incident side polarizing plate to designated temperatures even if the outside temperature becomes high. It is also possible to prevent adherence of dust to the liquid crystal panel.

The vaporizing portion of the heat pipe is heat-conductively joined to the hot-side face of the Peltier element while the condensing portion is heat-conductively joined to the radiator. Accordingly, the radiator for the liquid crystal projector can be positioned in a site where heat can be efficiently discharged from the radiator. Further, it is also possible to downsize the cooling system as well as to use a common fan which serves as both the radiating fan and the cooling fan for the projecting lamp.

Since the heat-insulating material for the cooling duct is provided between the heat-absorber and the heat-emitting portions such as the liquid crystal panel and the light-incident side polarizing plate, it is possible to prevent the cooled air from being heated form the outside. Accordingly, it is possible to efficiently cool the heat-emitting portions such as the liquid crystal panel and the light-incident side polarizing plate.

Air-temperature at the air-outlet of the liquid crystal panel and the light-incident side polarizing plate, and/or air-temperature at the air-inlet of the heat-absorber is detected by the temperature sensor and the temperature of the liquid crystal panel and the light-incident side polarizing plate is estimated based on the detected temperature, whereby the system controls the current flowing through the Peltier element and the rotational frequency of the cooling fan. Accordingly, it is possible to efficiently cool the heat-emitting portions such as the liquid crystal panel and the light-incident side polarizing plate and the like.

Air-temperatures at a portion where no light does pass by, on the liquid crystal panel and the light-incident side polarizing plate, and the temperatures of the liquid crystal panel and the light-incident side polarizing plate are estimated based on the detected temperature, whereby the system controls the current flowing through the Peltier element and the rotational frequency of the cooling fan. Accordingly, it is possible to efficiently cool the heat-emitting portions such as the liquid crystal panel and the light-incident side polarizing plate and the like.

Since, in a confined type cooling system, a gas having a good thermal conductivity such as helium gas, neon gas and the like with dirt and dust removed is hermetically charged inside said cooling duct, it is possible to efficiently cool the heat-emitting portions such as the liquid crystal panel and the light-incident side polarizing plate and the like. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thermoelectric cooling device for cooling by the Peltier effect, comprising:

a thermoelectric module made of a Peltier element;

a heat-absorber heat-conductively joined to a cold-side portion of said thermoelectric module;

a radiator heat-conductively joined to a hot-side portion of said thermoelectric module; and a module base, formed of a material having a high thermal-conductance, having a rectangular-projected portion and a flat portion, the cold-side portion or the hot-side portion of said thermoelectric module being in contact with the rectangular-projected portion of said module base such that when the cold-side portion is in contact with said module base, said heat-absorber contacts the flat portion of said module base and when the hot-side portion is in contact with said module base, said radiator contacts the flat portion of said module base.

2. A thermoelectric cooling device for cooling by the Peltier effect, comprising:

a thermoelectric module made of a Peltier element;

a heat-absorber heat-conductively joined to a cold-side portion of said thermoelectric module;

a radiator heat-conductively joined to a hot-side portion of said thermoelectric module; and a module base, formed of a material having a high thermal-conductance, having a rectangular-projected portion and a flat portion, the cold-side portion or the hot-side portion of said thermoelectric module being in contact with the flat portion of said module base such that when the cold-side portion is in contact with said module base, said heat-absorber contacts the rectangular-projected portion of said module base and when the hot-side face is in contact with said module base, said radiator contacts the rectangular-projected portion of said module base.

3. A thermoelectric cooling device for cooling by the Peltier effect, comprising:

a thermoelectric module made of a Peltier element;

a heat-absorber heat-conductively joined to a cold-side portion of said thermoelectric module;

a radiator heat-conductively joined to a hot-side portion of said thermoelectric module; and a module base of Z-shape in section and having flat portions and formed of a material having a high thermal-conductance, the cold-side portion or the hot-side portion of said thermoelectric module being in contact with one of the flat portions of said module base such that when the cold-side portion is in contact with said module base, said heat-absorber contacts the other flat portion of said module base and when the hot-side portion is in contact with said module base, said radiator contacts the other flat portion of said module base.

4. The thermoelectric cooling device according to claim 1, wherein when said heat-absorber or said radiator and said module base are arranged to sandwich said thermoelectric module therebetween and said heat-absorber or said radiator is fixed to said module base by fixing elements, attaching members made from a hard, and brittle or resilient material having low thermal-conductance are interposed between said heat-absorber or said radiator and said module base so that said fixing elements are not in contact with said module base.

5. The thermoelectric cooling device according to claim 2, wherein when said heat-absorber or said radiator and said module base are arranged to sandwich said thermoelectric module therebetween and said heat-absorber or said radiator is fixed to said module base by fixing elements, attaching members made from a hard, and brittle or resilient material having low thermal-conductance are interposed between said heat-absorber or said radiator and said module base so that said fixing elements are not in contact with said module base.

6. The thermoelectric cooling device according to claim 3, wherein when said heat-absorber or said radiator and said module base are arranged to sandwich said thermoelectric module therebetween and said heat-absorber or said radiator is fixed to said module base by fixing elements, attaching members made from a hard, and brittle or resilient material having low thermal-conductance are interposed between said heat-absorber or said radiator and said module base so that said fixing elements are not in contact with said module base.

7. A thermoelectric cooling device for cooling by the Peltier effect, comprising:

a thermoelectric module made of a Peltier element;

a heat-absorber heat-conductively coupled to a cold-side portion of said thermoelectric module;

a radiator heat-conductively coupled to a hot-side portion of said thermoelectric module; and a module base, formed of a material having a high thermal-conductance, having a rectangular-projected portion and a flat portion, said thermoelectric module contacting the rectangular-projected portion of said module base.

8. The thermoelectric cooling device of claim 7, wherein the cold-side portion of said thermoelectric module is in contact with the rectangular-projected portion of said module base and said heat absorber contacts the flat portion of said module base.

9. The thermoelectric cooling device of claim 7, wherein the hot-side portion of said thermoelectric module is in contact with the rectangular-projected portion of said module base and said radiator contacts the flat portion of said module base.

10. A thermoelectric cooling device for cooling by the Peltier effect, comprising:

a thermoelectric module made of a Peltier element;

a heat-absorber heat-conductively coupled to a cold-side portion of said thermoelectric module;

a radiator heat-conductively coupled to a hot-side portion of said thermoelectric module; and a module base, formed of a material having a high thermal-conductance, having a rectangular-projected portion and a flat portion, said thermoelectric module contacting the flat portion of said module base.

11. The thermoelectric cooling device of claim 10, wherein the cold-side portion of said thermoelectric module is in contact with the flat portion of said module base and said heat absorber contacts the rectangular-projected portion of said module base.

12. The thermoelectric cooling device of claim 10, wherein the hot-side portion of said thermoelectric module is in contact with the flat portion of said module base and said radiator contacts the rectangular-projected portion of said module base.

13. A thermoelectric cooling device for cooling by the Peltier effect, comprising:

a thermoelectric module mode of a Peltier element;

a heat-absorber heat-conductively coupled to a cold-side portion of said thermoelectric module;

a radiator heat-conductively coupled to a hot-side portion of said thermoelectric module; and a module base of Z-shape in section and having flat portions, formed of a material having a high thermal-conductance, said thermoelectric module contacting one of the flat portions of said module base.

14. The thermoelectric cooling device of claim 13, wherein the cold-side portion of said thermoelectric module is in contact with the one of the flat portions of said module base and said heat absorber contacts the other of the flat portions of said module base.

15. The thermoelectric cooling device of claim 13, wherein the hot-side portion of said thermoelectric module is in contact with the one of the flat portions of said module base and said radiator contacts the other of the flat portions of said module base.

* * * * *